(12) United States Patent
Zhou et al.

(10) Patent No.: US 12,446,407 B2
(45) Date of Patent: Oct. 14, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Da Zhou, Beijing (CN); Jianbo Wang, Beijing (CN); Taoran Zhang, Beijing (CN); Li Huang, Beijing (CN); Yang Zhou, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/773,600

(22) PCT Filed: Jul. 30, 2021

(86) PCT No.: PCT/CN2021/109868
§ 371 (c)(1),
(2) Date: Apr. 30, 2022

(87) PCT Pub. No.: WO2023/004803
PCT Pub. Date: Feb. 2, 2023

(65) Prior Publication Data
US 2024/0179948 A1    May 30, 2024

(51) Int. Cl.
*H10K 59/122*    (2023.01)
*H10K 59/131*    (2023.01)

(52) U.S. Cl.
CPC ......... *H10K 59/122* (2023.02); *H10K 59/131* (2023.02)

(58) Field of Classification Search
CPC ....... H10K 50/00–88; H10K 59/00–95; H10K 65/00; H10K 71/00–861;
(Continued)

(56) References Cited

U.S. PATENT DOCUMENTS 10,937,849 B2 * 3/2021 Cheng .................. H10D 89/931
2012/0153292 A1 6/2012 Nakamura et al.
(Continued)

FOREIGN PATENT DOCUMENTS

CN    102540603 A    7/2012
CN    110993670 A    4/2020
(Continued)

OTHER PUBLICATIONS

International Search Report & Written Opinion mailed Apr. 28, 2022, regarding PCT/CN2021/109868.

*Primary Examiner* — Christine S. Kim
*Assistant Examiner* — Cole Leon Lindsey
(74) *Attorney, Agent, or Firm* — Intellectual Valley Law, P.C.

(57) ABSTRACT

An array substrate includes a planarization layer; an anode material layer on the planarization layer and in a peripheral area of the array substrate; and a plurality of gas releasing vias extending through the anode material layer configured to release gas in the planarization layer during a fabrication process. An aperture size of a first respective gas releasing via in a first region is smaller than an aperture size of a second respective gas releasing via in a second region.

17 Claims, 28 Drawing Sheets

(58) Field of Classification Search
CPC . H10K 85/00–791; H10K 2101/00–90; H10K 2102/00–361; B32B 2457/206
See application file for complete search history.

(56) References Cited

U.S. PATENT DOCUMENTS

| | | | |
|---|---|---|---|
| 2018/0151838 A1* | 5/2018 | Park | G06F 3/0412 |
| 2021/0050246 A1 | 2/2021 | Choi et al. | |
| 2022/0216275 A1 | 7/2022 | Chen | |

FOREIGN PATENT DOCUMENTS

| | | |
|---|---|---|
| CN | 112164690 A | 1/2021 |
| CN | 112838110 A | 5/2021 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2021/109868, filed Jul. 30, 2021, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a planarization layer; an anode material layer on the planarization layer and in a peripheral area of the array substrate; and a plurality of gas releasing vias extending through the anode material layer configured to release gas in the planarization layer during a fabrication process; wherein an aperture size of a first respective gas releasing via in a first region is smaller than an aperture size of a second respective gas releasing via in a second region.

Optionally, the array substrate further comprises a pixel definition material layer comprising a plurality of via blocks spaced apart from each other on the anode material layer, a respective via block covering and filling a respective gas releasing via; wherein a portion of the respective via block outside the respective gas releasing via has a width greater than an aperture width of the respective gas releasing via.

Optionally, a first ratio of a first width of a first respective via block to a first aperture width of a first respective gas releasing via in the first region is greater than a second ratio of a second width of a second respective via block to a second aperture width of a second respective gas releasing via in the second region.

Optionally, the first width and the second width are substantially the same; and the first aperture width is smaller than the second aperture width.

Optionally, the plurality of via blocks are on a first portion of the anode material layer in a first sub-area of the peripheral area; the pixel definition material layer further comprises a pixel definition layer defining subpixel apertures for light emitting elements; and the pixel definition layer extends into a second sub-area of the peripheral area, covering and filling gas releasing vias in a second portion of the anode material layer.

Optionally, the pixel definition layer continuously extends throughout in the second sub-area of the peripheral area.

Optionally, in at least one corner region of the array substrate, at least one gas releasing via in the first sub-area has an aperture size smaller than an aperture size of at least one gas releasing via in the second sub-area.

Optionally, in at least one non-corner region of the array substrate, at least one gas releasing via in the first sub-area has an aperture size substantially the same as an aperture size of at least one gas releasing via in the second sub-area.

Optionally, at least one gas releasing via underneath an edge part of the pixel definition layer bordering the first sub-area has an aperture size smaller than an aperture size of at least one gas releasing via in the first sub-area, and smaller than an aperture size of at least one gas releasing via underneath a non-edge part of the pixel definition layer.

Optionally, at least one gas releasing via in the first sub-area bordering an edge part of the pixel definition layer has an aperture size smaller than an aperture size of at least another gas releasing via in the first sub-area, the at least another gas releasing via being spaced apart from the edge part by the at least one gas releasing via.

Optionally, at least one gas releasing via in the first sub-area and in a corner region of the array substrate has an aperture size smaller than an aperture size of at least one gas releasing via in the first sub-area in a non-corner region of the array substrate.

Optionally, the peripheral area comprises a first side-area on a first side of a display area, a second side-area on a second side of the display area, a third side-area on a third side of the display area, a fourth side-area on a fourth side of the display area; the first side and the fourth side are opposite to each other; the second side and the third side are opposite to each other; the first side-area is configured to bond an integrated circuit; at least one gas releasing via in the first sub-area and in a corner region connecting the second side-area and the fourth side-area or a corner region connecting the third side-area and the fourth side-area has an aperture size smaller than an aperture size of at least one gas releasing via in the first sub-area and in a corner region connecting the first side-area and the second side-area or a corner region connecting the first side-area and the third side-area.

Optionally, the at least one gas releasing via in the first sub-area and in a corner region connecting the first side-area and the second side-area or a corner region connecting the first side-area and the third side-area has an aperture size smaller than an aperture size of at least one gas releasing via in the first sub-area and in a non-corner region of the array substrate.

Optionally, the array substrate comprises a peripheral voltage supply line in the peripheral area; wherein the anode material layer is a layer of the peripheral voltage supply line.

Optionally, the peripheral voltage supply line is a signal line configured to provide a voltage signal to a cathode of a light emitting element in a display area of the array substrate.

Optionally, the array substrate further comprises a pixel definition material layer on the anode material layer; wherein the peripheral voltage supply line further comprises a cathode material layer in the peripheral area and on a side of the pixel definition material layer and the anode material layer away from the planarization layer; and the cathode material layer is connected to the anode material layer.

Optionally, the pixel definition material layer comprises a plurality of via blocks spaced apart from each other on the anode material layer, a respective via block covering and filling a respective gas releasing via; and a pixel definition layer defining subpixel apertures for light emitting elements, respectively; wherein the plurality of via blocks are in a first sub-area of the peripheral area; the pixel definition layer extends into a second sub-area of the peripheral area; and the cathode material layer is at least partially present in the first sub-area and at least partially absent in the second sub-area.

Optionally, the peripheral voltage supply line further comprises a signal line material layer on a side of the planarization layer away from the anode material layer; and the anode material layer is connected to the signal line material layer through one or more peripheral vias in the peripheral area and extending through the planarization layer.

Optionally, the array substrate further comprises a plurality of second gas releasing vias extending through the signal line material layer for releasing gas in an insulating layer underneath the signal line material layer during a fabrication process; and an orthographic projection of a second gas releasing via in the signal line material layer on a base substrate at least partially overlaps with an orthographic projection of a gas releasing via in the anode material layer on the base substrate.

Optionally, a ratio of the aperture size of the first respective gas releasing via in the first region to the aperture size of the second respective gas releasing via in the second region is in a range of 1:1.5 to 1:5.0.

Optionally, the first ratio is greater than the second ratio by 25% to 250%.

Optionally, a first thickness of a first respective via block in the first region is greater than a second thickness of a second respective via block in the second region.

Optionally, aperture sizes of gas releasing vias covered and filled by the first respective via block and the second respective via block, respectively, are substantially the same.

In another aspect, the present disclosure provides a display apparatus, comprising the array substrate described herein or fabricated by a method described herein, and one or more integrated circuits connected to the array substrate in an integrated circuit bonding region.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating an organic light emitting diode array substrate, organic light emitting material layers are typically deposited by evaporation onto a substrate using a fine metal mask. One of the issues with the fine metal mask resides in that the fine metal mask may be in contact with the substrate. When the fine metal mask is in close contact with the substrate, often times electrostatic discharge occurs between the fine metal mask and portions of the substrate. The electrostatic discharge may in some cases damage the encapsulating structure on the substrate, leading to failure of the encapsulation. As a result, the display panel fabricated may have a growing dark spot issue, adversely affecting display quality.

Figure 1:
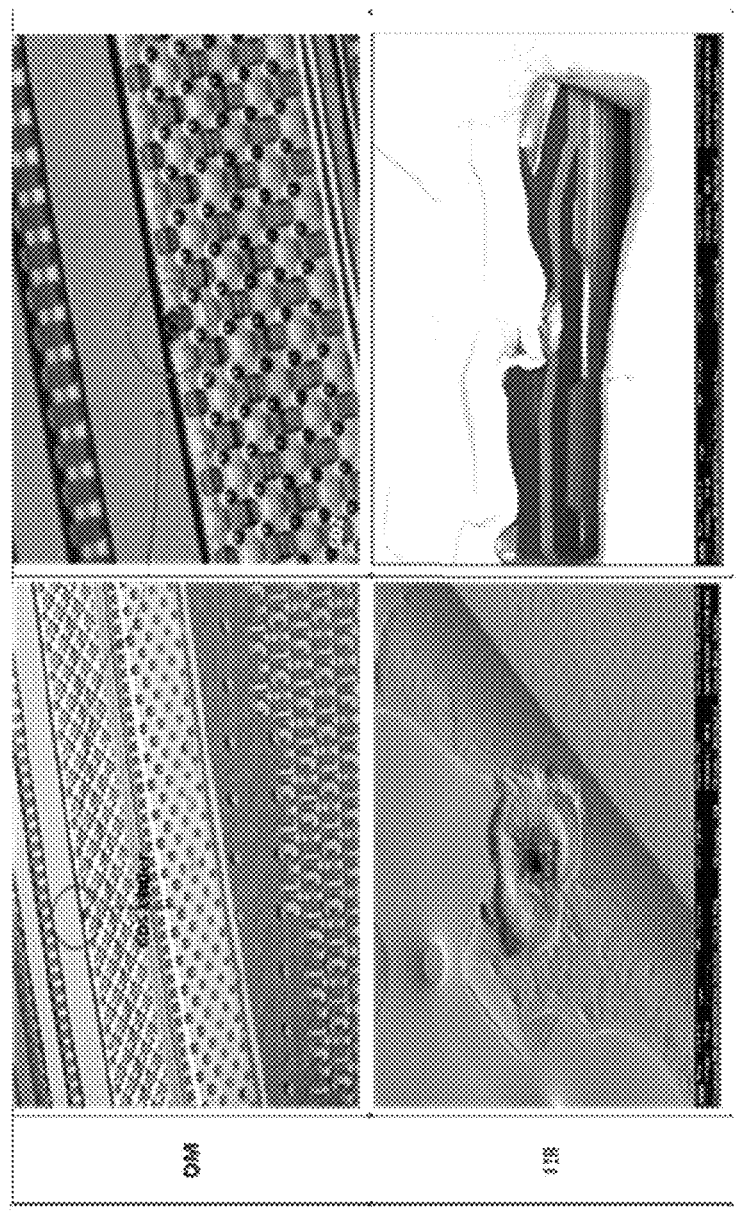
FIG. 1 shows optical microscopy and focused ion beam images of damages caused by electrostatic discharge between a fine metal mask and a substrate.

FIG. 1 shows optical microscopy and focused ion beam images of damages caused by electrostatic discharge between a fine metal mask and a substrate. Referring to FIG. 1, the upper left image is an optical microscopy image revealing a damaged spot in the substrate (the dark spot in the circle) caused by the electrostatic discharge. The upper right image is a zoom-in view of the damaged spot in the upper left image. The lower left image is a focused ion beam image of the damaged spot. The lower right image is another focused ion beam image showing damaged layers in the damaged spot.

Figure 2:
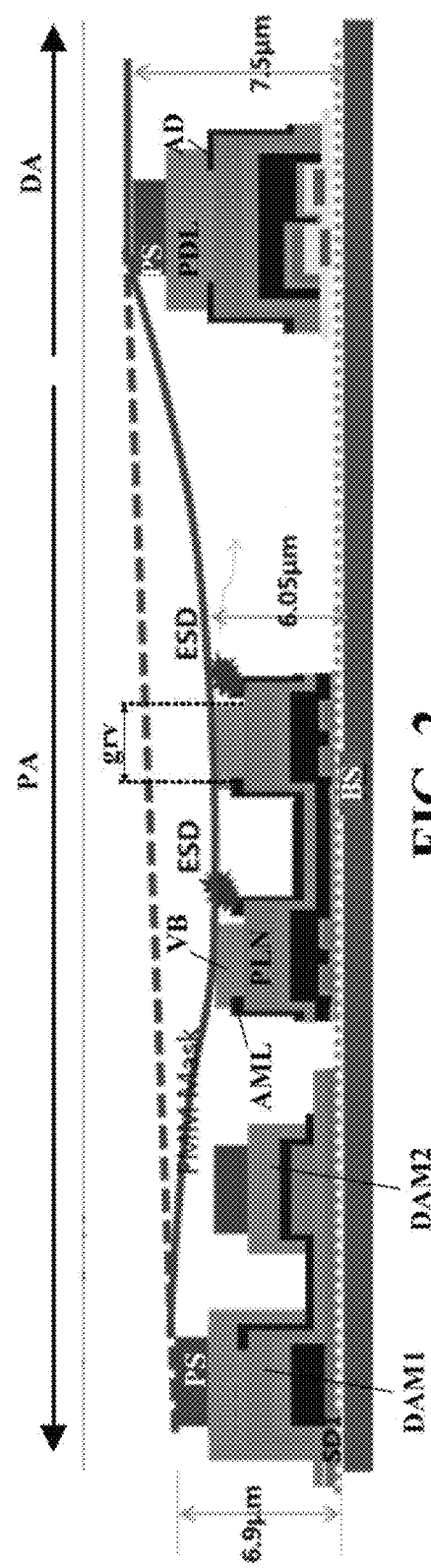
FIG. 2 illustrates a mechanism of occurrence of electrostatic discharge in a fabrication process of an array substrate.

FIG. 2 illustrates a mechanism of occurrence of electrostatic discharge in a fabrication process of an array substrate. Referring to FIG. 2, a fine metal mask ("FMM Mask") is placed on top of a substrate having a plurality of layers fabricated, including a planarization layer PLN, an anode material layer AML in a peripheral area PA of the substrate and on the planarization layer PLN, and a plurality of gas releasing vias grv extending through the anode material layer AML configured to release gas in the planarization layer PLN during a fabrication process. The anode material layer AML is in a same layer as an anode AD of a light emitting element in a display area DA of the substrate. The plurality of via blocks VB are in a same layer as a pixel definition layer PDL in the display area DA. The substrate further includes a plurality of via blocks VB spaced apart from each other on the anode material layer AML. A respective via block is in a respective gas releasing via.

As shown in FIG. 2, when the fine metal mask is placed on the substrate, the fine metal mask is supported in part by a spacer layer PS on a first barrier layer DAM1 and on the pixel definition layer PDL. A second barrier layer DAM2 is shorter than the first barrier layer DAM1, thus it does not support the fine metal mask. Due to magnetic attraction effect between the fine metal mask and the substrate, the fine metal mask undergoes deformation, moving toward the substrate. When an edge of the anode material layer AML along the gas releasing vias grv is not completely wrapped or coated by the plurality of via blocks VB, the edge of the anode material layer AML is exposed. Electrostatic discharge occurs between the fine metal mask and the edge of the anode material layer AML, damaging the substrate during the deposition process.

Accordingly, the present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a planarization layer; an anode material layer on the planarization layer and in a peripheral area of the array substrate; and a plurality of gas releasing vias extending through the anode material layer configured to release gas in the planarization layer during a fabrication process. Optionally, an aperture size of a first respective gas releasing via in a first region is smaller than an aperture size of a second respective gas releasing via in a second region. As used herein, the term aperture size refers to an aperture area or an aperture width. In one example, the term aperture size refers to a maximum aperture width of an aperture, e.g., a largest width across the aperture. In another example, the term aperture size refers to an average aperture width of an aperture. In another example, the term aperture size refers to a minimum aperture width of an aperture.

Figure 3A:
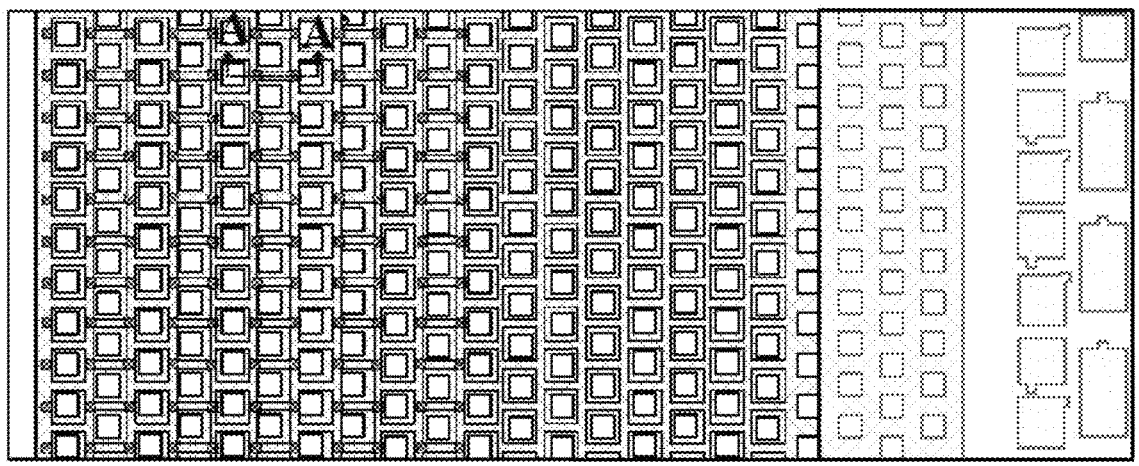
FIG. 3A is a schematic diagram illustrating the structure of selected layers in a peripheral area of an array substrate in some embodiments according to the present disclosure.
Figure 3B:
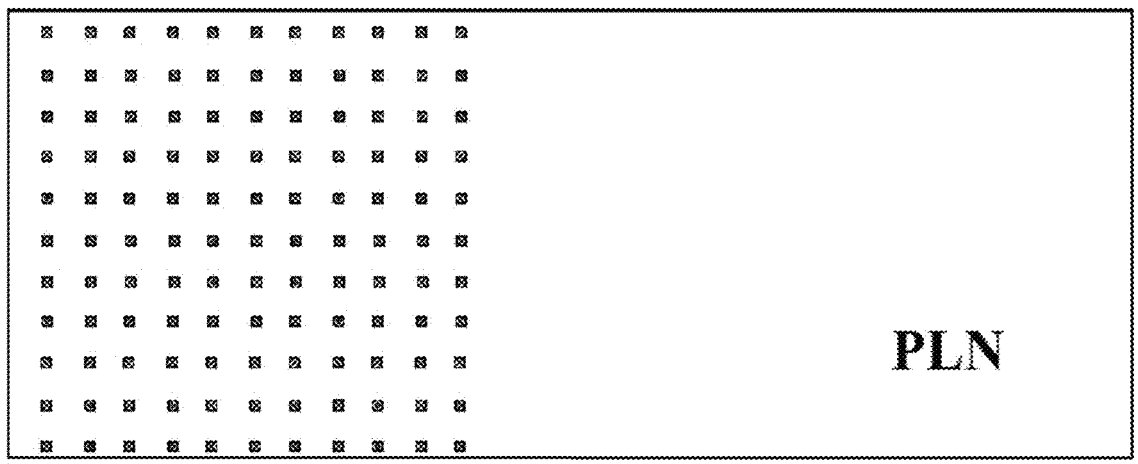
FIG. 3B is a schematic diagram illustrating the structure of a planarization layer in FIG. 3A.
Figure 3C:
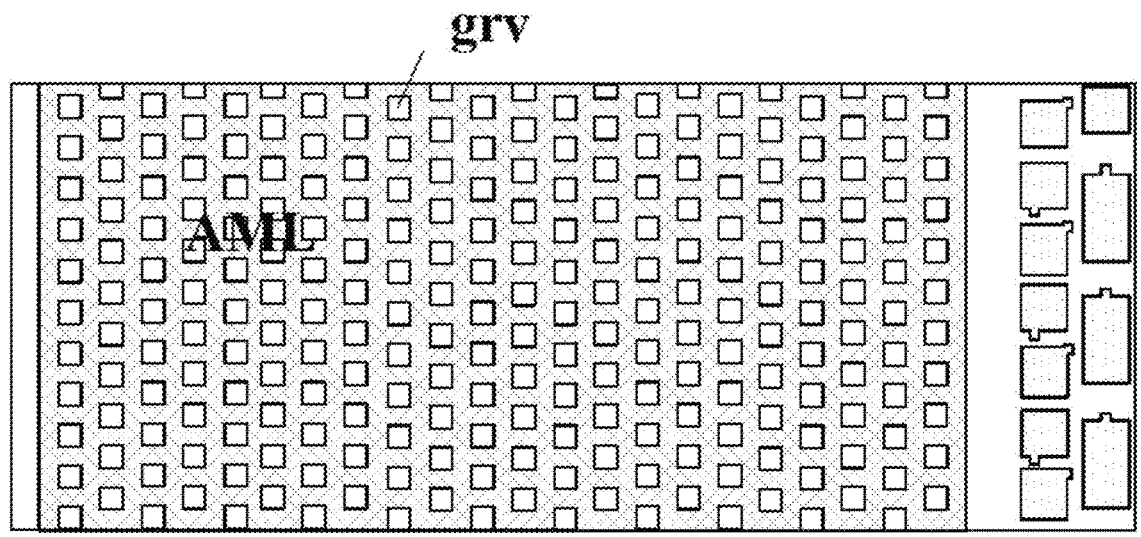
FIG. 3C is a schematic diagram illustrating the structure of an anode material layer in FIG. 3A.
Figure 3D:
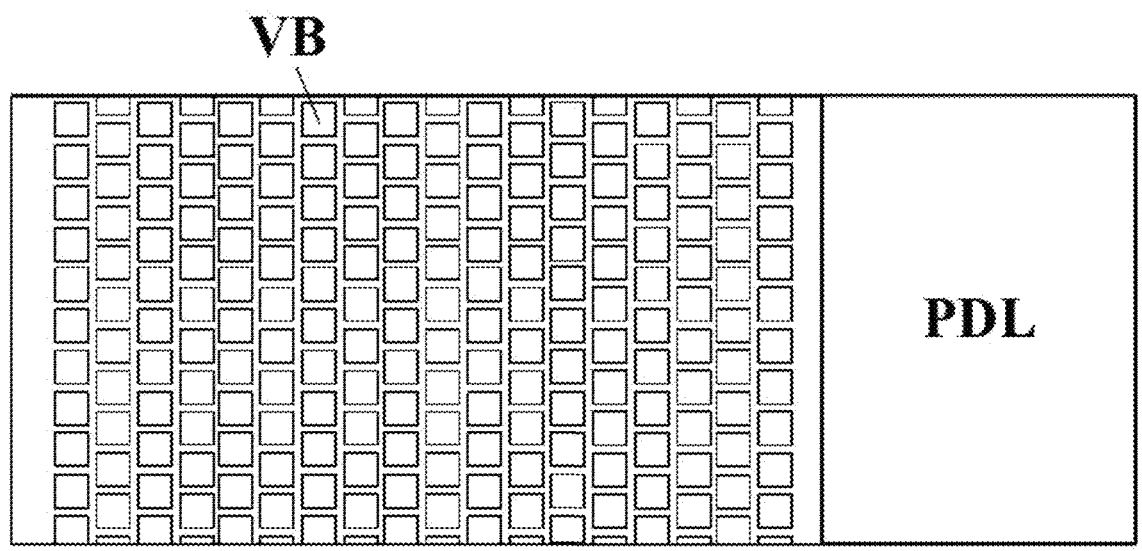
FIG. 3D is a schematic diagram illustrating the structure of a pixel definition material layer in FIG. 3A.

FIG. 3A is a schematic diagram illustrating the structure of selected layers in a peripheral area of an array substrate in some embodiments according to the present disclosure. FIG. 3B is a schematic diagram illustrating the structure of a planarization layer in FIG. 3A. FIG. 3C is a schematic diagram illustrating the structure of an anode material layer in FIG. 3A. FIG. 3D is a schematic diagram illustrating the structure of a pixel definition material layer in FIG. 3A. Referring to FIG. 3A to FIG. 3C, the array substrate in some embodiments includes a planarization layer PLN; an anode material layer AML on the planarization layer PLN and in a peripheral area of the array substrate; and a plurality of gas releasing vias grv extending through the anode material layer AML configured to release gas in the planarization layer PLN during a fabrication process. Referring to FIG. 3A and FIG. 3D, the array substrate in some embodiments further includes a pixel definition material layer including a plurality of via blocks VB spaced apart from each other on the anode material layer AML.

Figure 3E:
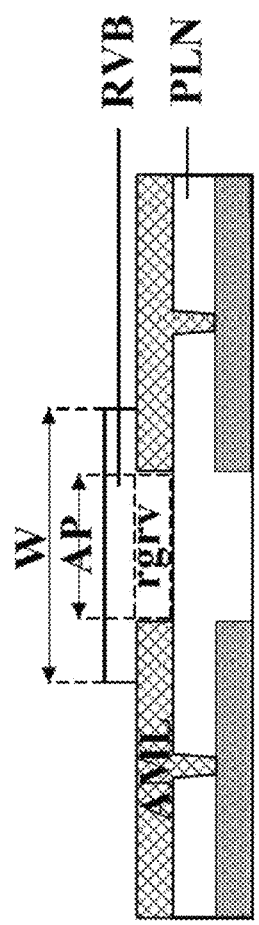
FIG. 3E is a cross-sectional view along a A-A' line in FIG. 3A.

FIG. 3E is a cross-sectional view along a A-A' line in FIG. 3A. As shown in FIG. 3E, a respective via block RVB covers and fills a respective gas releasing via rgrv. A portion of the respective via block RVB outside the respective gas releasing via rgrv has a width W greater than an aperture width AP of the respective gas releasing via rgrv.

In some embodiments, gas releasing vias grv have different aperture sizes in different regions, respectively. Optionally, an aperture size of a first respective gas releasing via in a first region is smaller than an aperture size of a second respective gas releasing via in a second region. In some embodiments, a ratio of the aperture size of the first respective gas releasing via in the first region to the aperture size of the second respective gas releasing via in the second region is in a range of 1:1.5 to 1:5.0, e.g., 1:1.5 to 1:2.0, 1:2.0 to 1:2.5, 1:2.5 to 1:3.0, 1:3.0 to 1:3.5, 1:3.5 to 1:4.0, 1:4.0 to 1:4.5, or 1:4.5 to 1:5.0. In some embodiments, the aperture size of the first respective gas releasing via in the first region is smaller than the aperture size of the second respective gas releasing via in the second region by at least 5%, e.g., at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, or at least 85%.

In some embodiments, gas releasing vias grv have different aperture widths in different regions, respectively. Optionally, an aperture width of a first respective gas releasing via in a first region is smaller than an aperture width of a second respective gas releasing via in a second region. In some embodiments, a ratio of the aperture width of the first respective gas releasing via in the first region to the aperture width of the second respective gas releasing via in the second region is in a range of 1:1.5 to 1:5.0, e.g., 1:1.5 to 1:2.0, 1:2.0 to 1:2.5, 1:2.5 to 1:3.0, 1:3.0 to 1:3.5, 1:3.5 to 1:4.0, 1:4.0 to 1:4.5, or 1:4.5 to 1:5.0. In some embodiments, the aperture width of the first respective gas releasing via in the first region is smaller than the aperture width of the second respective gas releasing via in the second region by at least 5%, e.g., at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, or at least 85%. In one example, the term aperture width refers to a maximum aperture width. In another example, the term aperture width refers to a maximum aperture width of an aperture, e.g., a largest width across the aperture. In another example, the term aperture width refers to an average aperture width of an aperture. In another example, the term aperture width refers to a minimum aperture width of an aperture.

Figure 4:
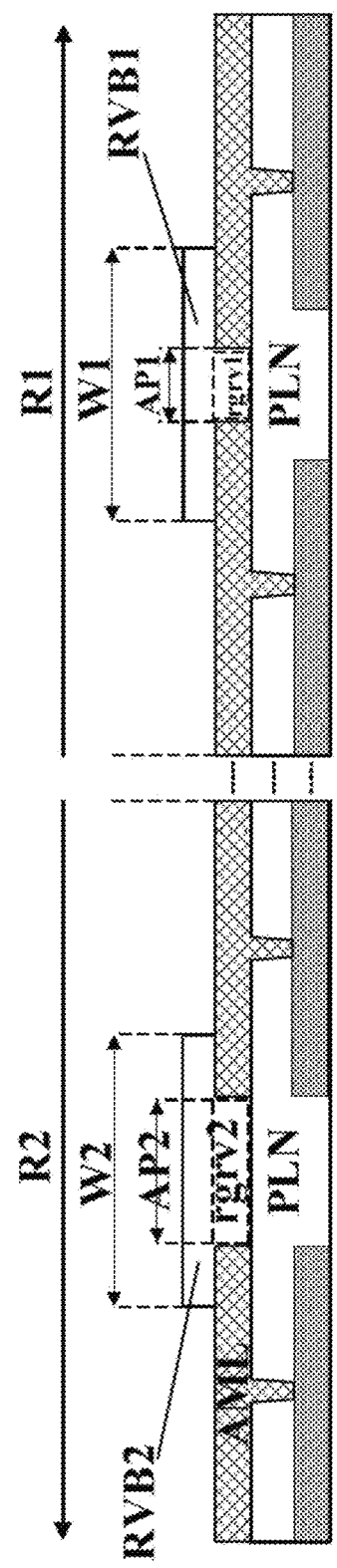
FIG. 4 illustrates the structure of selected layers in a first region and a second region of a peripheral area of an array substrate in some embodiments according to the present disclosure.

FIG. 4 illustrates the structure of selected layers in a first region and a second region of a peripheral area of an array substrate in some embodiments according to the present disclosure. Referring to FIG. 4, the peripheral area of the array substrate includes a first region R1 and a second region R2. In the first region R1, a first respective gas releasing via rgrv1 has a first aperture width AP1. In the second region R2, a second respective gas releasing via rgrv2 has a second aperture width AP2. Optionally, the first aperture width AP1 is smaller than the second aperture width AP2.

As discussed above, the electrostatic discharge issues are related to exposed edges of the anode material layer that are not sufficiently coated by the plurality of via blocks or by the pixel definition layer. Thus, in some embodiments, problematic regions of the array substrate in which the edges of the anode material layer are prone to be exposed can be identified. In the identified regions (the "first region"), the array substrate can have a structure that is different from that in regions where the anode material layer edges are not exposed (the "second region").

Figure 5:
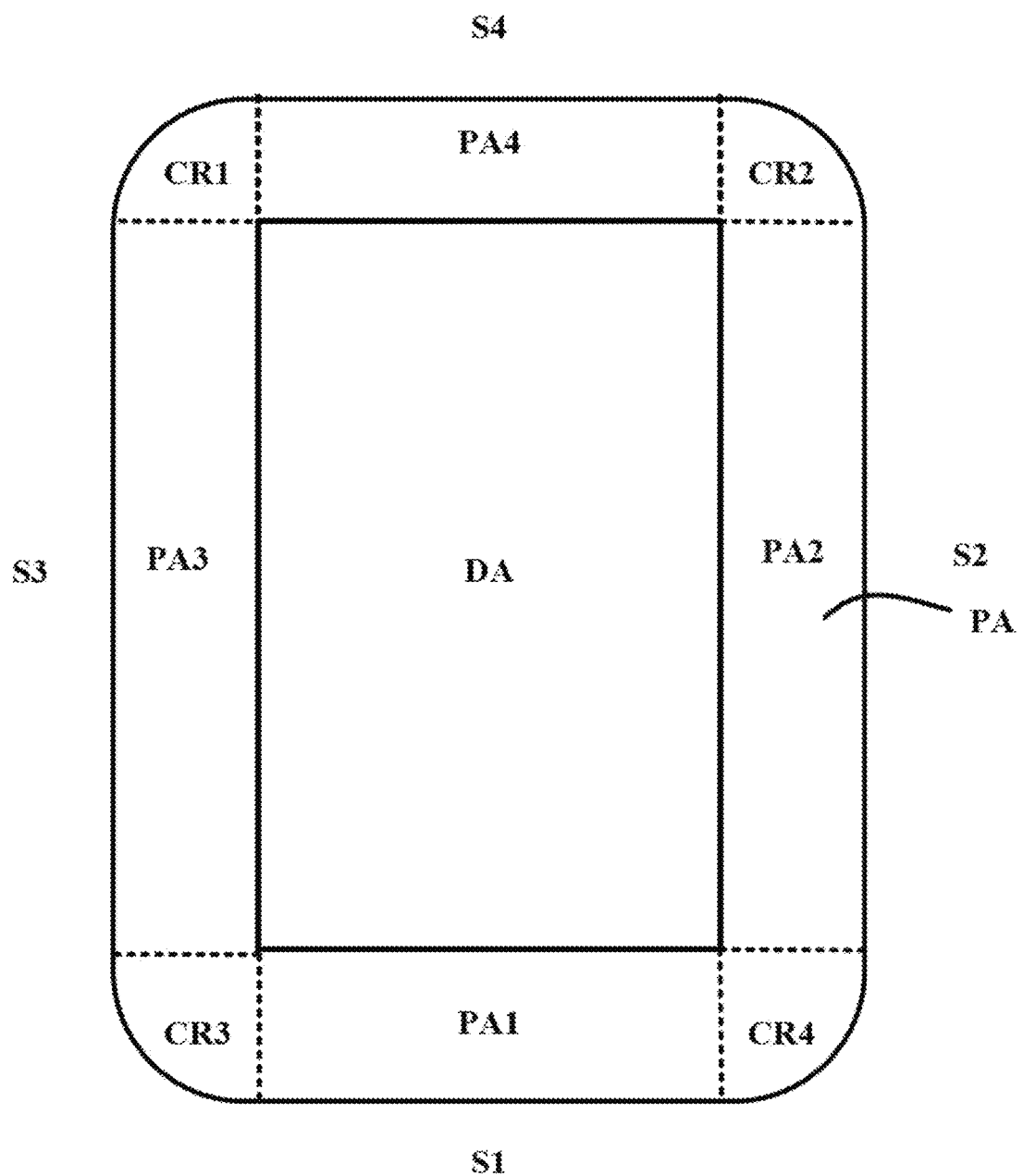
FIG. 5 is a schematic diagram illustrating a display area and a peripheral area in an array substrate in some embodiments according to the present disclosure.

FIG. 5 is a schematic diagram illustrating a display area and a peripheral area in an array substrate in some embodiments according to the present disclosure. Referring to FIG. 5, in some embodiments, the array substrate includes a display area DA and a peripheral area PA. In some embodiments, the peripheral area PA includes a first side-area PA1 on a first side S1 of the display area DA, a second side-area PA2 on a second side S2 of the display area DA, a third side-area PA3 on a third side S3 of the display area DA, a fourth side-area PA4 on a fourth side S4 of the display area DA. Optionally, the first side S1 and the fourth side S4 are opposite to each other. Optionally, the second side S2 and the third side S3 are opposite to each other. Optionally, the first side-area PA1 includes an integrated circuit bonding region onto which an integrated circuit such as a display control integrated circuit and/or a touch control integrated circuit is bonded. In some embodiments, the peripheral area PA further includes a first corner region CR1 connecting the third side-area PA3 and the fourth side-area PA4, a second corner region CR2 connecting the second side-area PA2 and the fourth side-area PA4, a third corner region CR3 connecting the first side-area PA1 and the third side-area PA3, and a fourth corner region CR4 connecting the first side-area PA1 and the second side-area PA2.

Referring to FIG. 5, the inventors of the present disclosure discover that the first corner region CR1 and/or the second corner region CR2 are regions where edges of anode material layer along the aperture of the gas releasing vias are prone to be exposed. The issue becomes particularly serious when the corner region is a radiused corner region, and particularly when the radiused corner region has a relatively large curvature. The inventors of the present disclosure discover that, in these corner regions, an alignment between the pixel definition material layer (including the plurality of via blocks and the pixel definition layer) and the anode material layer cannot be maintained with high precision, as compared to other regions of the peripheral area. As a result of misalignment, edges of the anode material layer along the aperture of the gas releasing vias are prone to be exposed.

Accordingly, in some embodiments, the peripheral area of the array substrate includes a first region R1 and a second region R2. In the first region R1, a first respective gas releasing via rgrv1 has a first aperture width AP1. In the second region R2, a second respective gas releasing via rgrv2 has a second aperture width AP2. Optionally, the first aperture width AP1 is smaller than the second aperture width AP2. Optionally, the first region R1 is in a first corner region CR1. Optionally, the first region R1 is in a second corner region CR2. Optionally, the second region R2 is a region outside of a corner region of the array substrate, in which the array substrate comprises a plurality of via blocks spaced apart from each other on the anode material layer, a respective via block covering and filling a respective gas releasing via. Optionally, the second region R2 is in the first side-area PA1. Optionally, the second region R2 is in the second side-area PA2. Optionally, the second region R2 is in the third side-area PA3. Optionally, the second region R2 is in the fourth side-area PA4.

Figure 6:
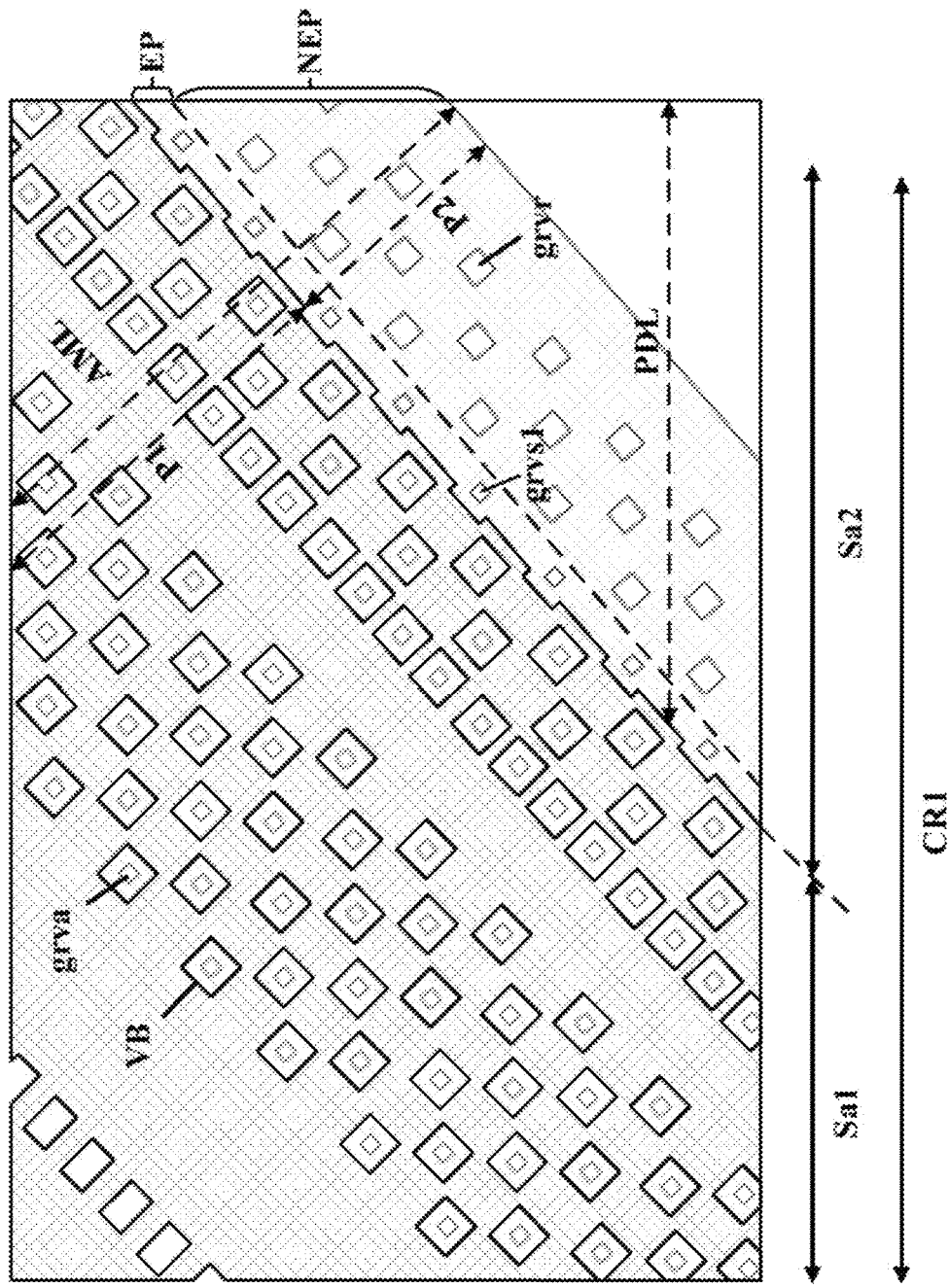
FIG. 6 is a schematic diagram illustrating the structure of selected layers in a first corner region in an array substrate in some embodiments according to the present disclosure.
Figure 7:
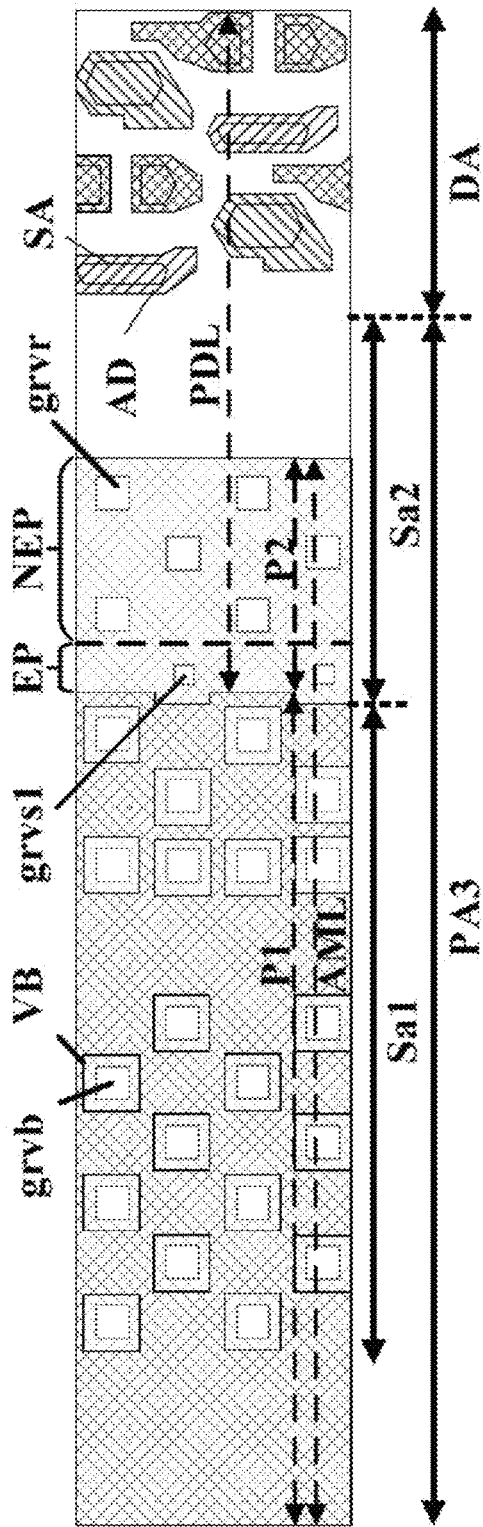
FIG. 7 is a schematic diagram illustrating the structure of selected layers in a third side-area of a peripheral area and a portion of a display area in an array substrate in some embodiments according to the present disclosure.
Figure 8:
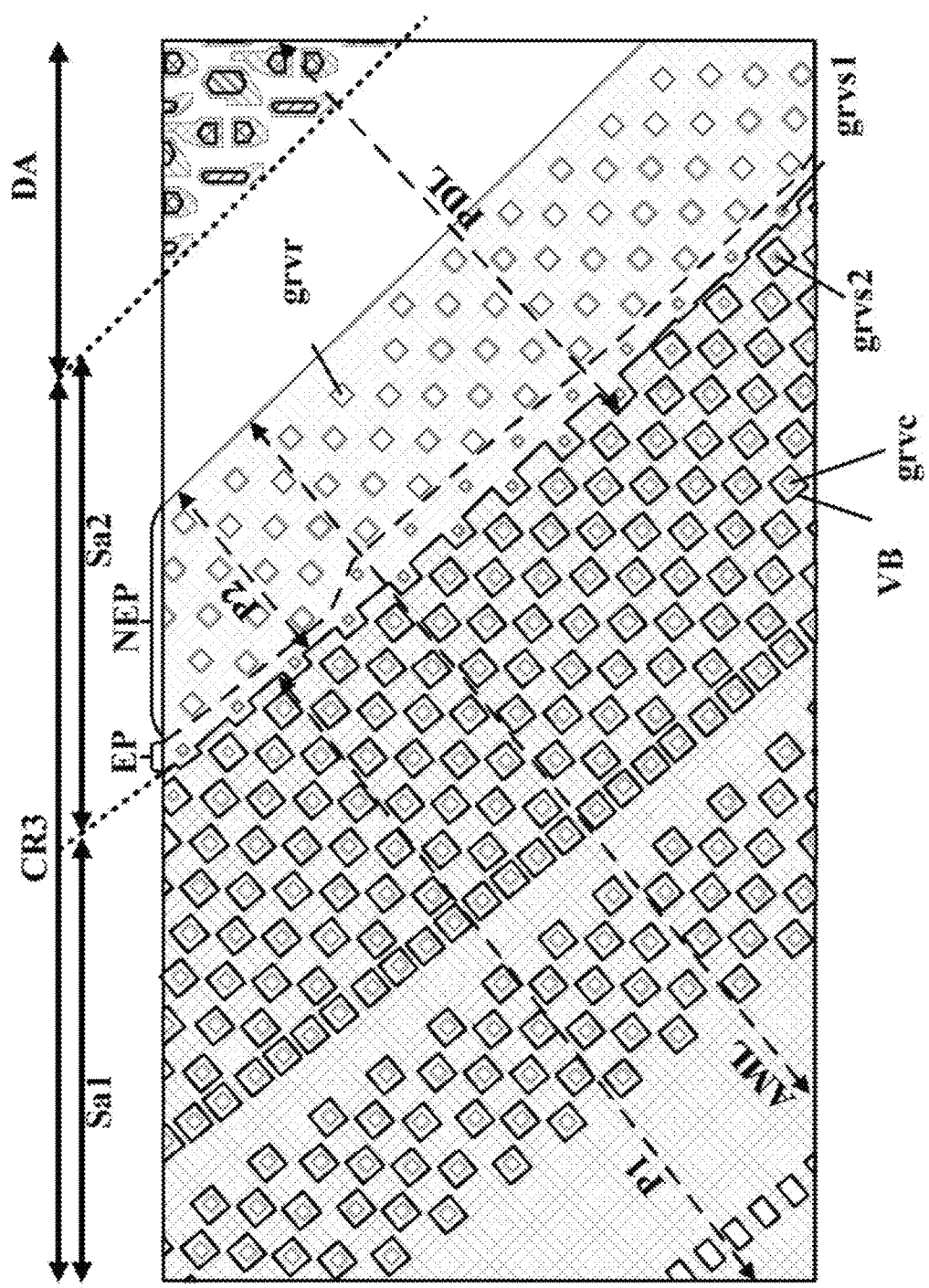
FIG. 8 is a schematic diagram illustrating the structure of selected layers in a third corner region and a portion of a display area in an array substrate in some embodiments according to the present disclosure.
Figure 9A:
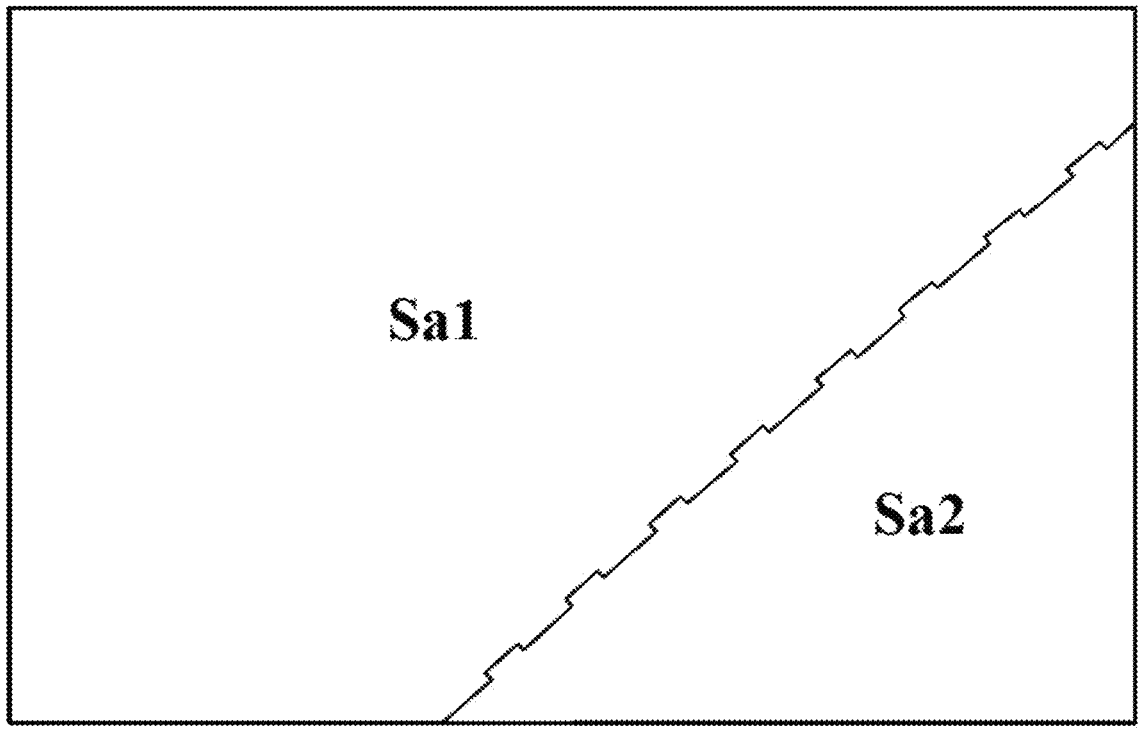
FIG. 9A illustrates a first sub-area and a second sub-area of a peripheral area depicted in FIG. 6.
Figure 9B:
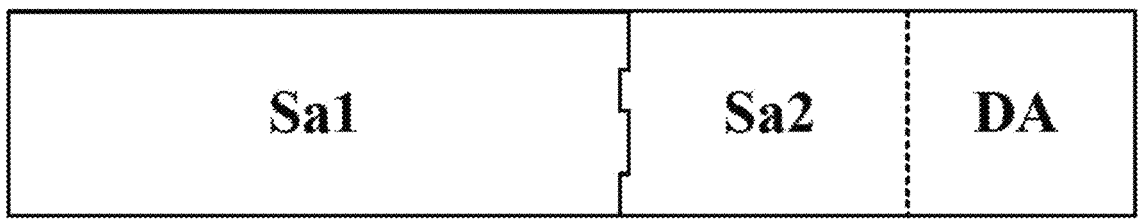
FIG. 9B illustrates a first sub-area and a second sub-area of a peripheral area depicted in FIG. 7.
Figure 9C:
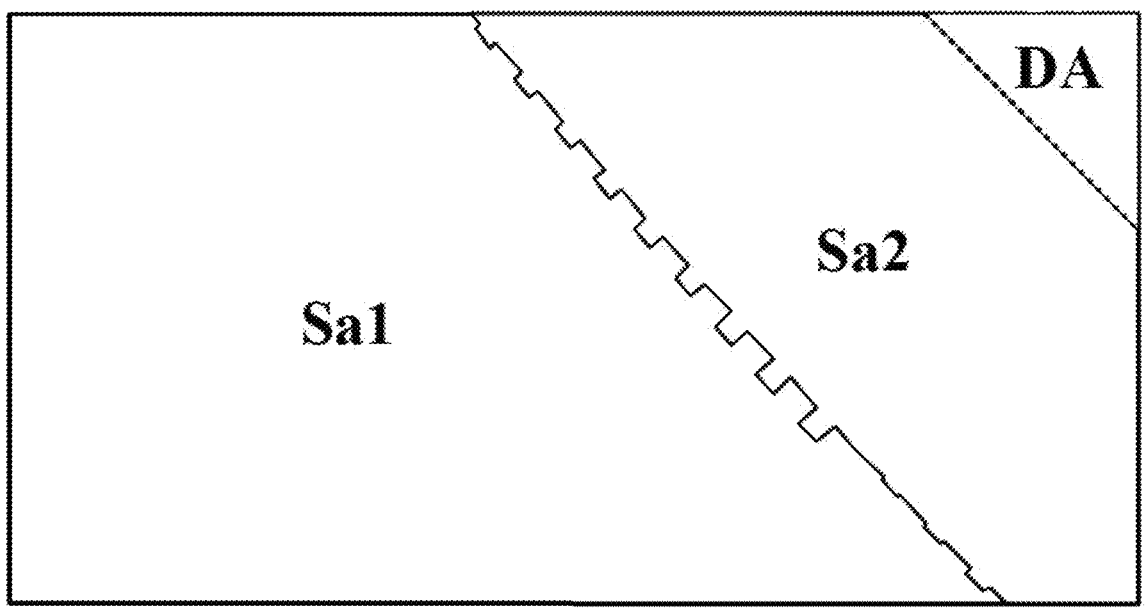
FIG. 9C illustrates a first sub-area and a second sub-area of a peripheral area depicted in FIG. 8.
Figure 10A:
FIG. 10A illustrates a first portion and a second portion of an anode material layer depicted in FIG. 6.
Figure 10B:
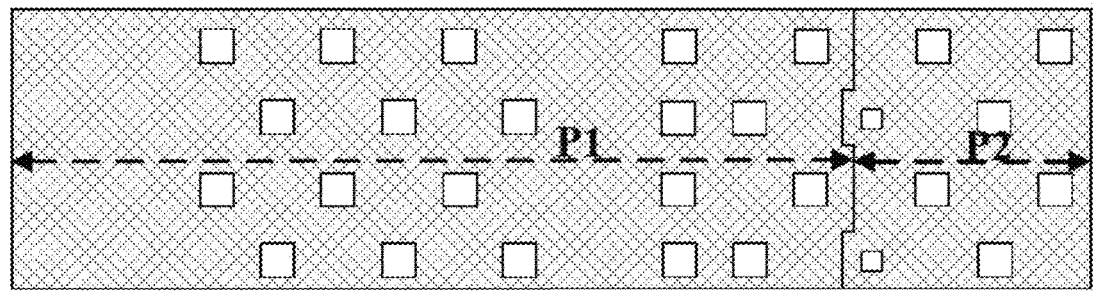
FIG. 10B illustrates a first portion and a second portion of an anode material layer depicted in FIG. 7.
Figure 10C:
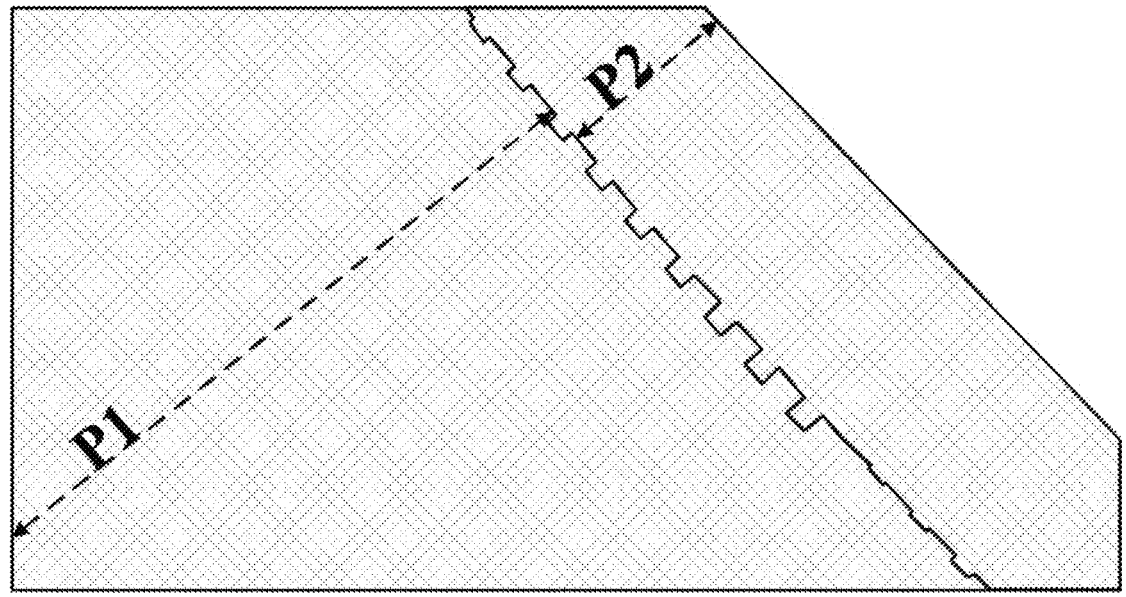
FIG. 10C illustrates a first portion and a second portion of an anode material layer depicted in FIG. 8.

FIG. 6 is a schematic diagram illustrating the structure of selected layers in a first corner region in an array substrate in some embodiments according to the present disclosure. FIG. 7 is a schematic diagram illustrating the structure of selected layers in a third side-area of a peripheral area and a portion of a display area in an array substrate in some embodiments according to the present disclosure. FIG. 8 is a schematic diagram illustrating the structure of selected layers in a third corner region and a portion of a display area in an array substrate in some embodiments according to the present disclosure. FIG. 9A illustrates a first sub-area and a second sub-area of a peripheral area depicted in FIG. 6. FIG. 9B illustrates a first sub-area and a second sub-area of a peripheral area depicted in FIG. 7. FIG. 9C illustrates a first sub-area and a second sub-area of a peripheral area depicted in FIG. 8. FIG. 10A illustrates a first portion and a second portion of an anode material layer depicted in FIG. 6. FIG. 10B illustrates a first portion and a second portion of an anode material layer depicted in FIG. 7. FIG. 10C illustrates a first portion and a second portion of an anode material layer depicted in FIG. 8. Referring to FIG. 6 to 8, FIG. 9A to FIG. 9C, and FIG. 10A to FIG. 10C, the array substrate further includes a plurality of anodes AD respectively of a plurality of light emitting elements. Optionally, the anode material layer AML and the plurality of anodes AD are in a same layer. Optionally, the anode material layer AML includes a first portion P1 in a first sub-area Sa1 of the peripheral area and a second portion P2 in a second sub-area Sa2 of the peripheral area.

In some embodiments, the array substrate further includes a pixel definition material layer. In some embodiments, the pixel definition material layer includes a plurality of via blocks VB, and a pixel definition layer PDL. The plurality of via blocks VB are on a first portion P1 of the anode material layer AML in a first sub-area Sa1 of the peripheral area. The pixel definition layer PDL is mostly in the display area DA, defining subpixel apertures SA for the plurality of light emitting elements (see, e.g., FIG. 7). The pixel definition layer PDL extends from the display area DA into a second sub-area Sa2 of the peripheral area, covering and filling gas releasing vias in a second portion P2 of the anode material layer AML. Optionally, the pixel definition layer PDL continuously extends throughout in the second sub-area Sa2 of the peripheral area.

In some embodiments, in at least one corner region of the array substrate, at least one gas releasing via in the first sub-area has an aperture size (e.g., an aperture width) smaller than an aperture size (e.g., an aperture width) of at least one gas releasing via in the second sub-area. Referring to FIG. 6, in the first corner region CR1, at least a gas releasing via grva in the first sub-area Sa1 has an aperture size smaller than an aperture size of at least a gas releasing via grv in the second sub-area Sa2. Optionally, the second corner region (CR2 in FIG. 5) has a layout similar to that of the first corner region CR1, with a mirror symmetry with respect to each other. Optionally, in the second corner region CR2, at least a gas releasing via in the first sub-area Sa1 has an aperture size smaller than an aperture size of at least a gas releasing via in the second sub-area Sa2.

In some embodiments, in at least one corner region of the array substrate, a ratio of the aperture size (e.g., the aperture width) of the at least one gas releasing via in the first sub-area to the aperture size (e.g., the aperture width) of the at least one gas releasing via in the second sub-area is in a range of 1:1.5 to 1:5.0, e.g., 1:1.5 to 1:2.0, 1:2.0 to 1:2.5, 1:2.5 to 1:3.0, 1:3.0 to 1:3.5, 1:3.5 to 1:4.0, 1:4.0 to 1:4.5, or 1:4.5 to 1:5.0. In some embodiments, in at least one corner region of the array substrate, the aperture size (e.g., the aperture width) of the at least one gas releasing via in the first sub-area is smaller than the aperture size (e.g., the aperture width) of the at least one gas releasing via in the second sub-area by at least 5%, e.g., at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, or at least 85%.

Referring to FIG. 8, in the third corner region CR3, at least a gas releasing via grvc in the first sub-area Sa1 has an aperture size (e.g., an aperture width) smaller than an aperture size (e.g., an aperture width) of at least a gas releasing via grvr in the second sub-area Sa2. Optionally, the fourth corner region (CR4 in FIG. 5) has a layout similar to that of the third corner region CR3, optionally with a mirror symmetry with respect to each other. Optionally, in the fourth corner region CR4, at least a gas releasing via in the first sub-area Sa1 has an aperture size of at least a gas releasing via in the second sub-area Sa2.

In some embodiments, in at least one non-corner region of the array substrate, at least one gas releasing via in the first sub-area has an aperture size (e.g., an aperture width) substantially the same as an aperture size (e.g., an aperture width) of at least one gas releasing via in the second sub-area. Referring to FIG. 7, in the third side-area PA3 (a non-corner region), at least a gas releasing via grvb in the first sub-area Sa1 has an aperture size substantially the same as an aperture size of a gas releasing via grvr in the second sub-area Sa2. Optionally, the first side-area (PA1 in FIG. 5), the second side-area (PA2 in FIG. 5), and the fourth side-area (PA4 in FIG. 5) are all non-corner regions, and have a layout similar to that of the third side-area PA3. Optionally, in the first side-area PA1, at least one gas releasing via in the first sub-area Sa1 has an aperture size substantially the same as an aperture size of at least one gas releasing via in the second sub-area Sa2. Optionally, in the second side-area PA2, at least one gas releasing via in the first sub-area Sa1 has an aperture size substantially the same as an aperture size of at least one gas releasing via in the second sub-area Sa2. Optionally, in the fourth side-area PA4, at least one gas releasing via in the first sub-area Sa1 has an aperture size substantially the same as an aperture size of at least one gas releasing via in the second sub-area Sa2.

In some embodiments, at least a gas releasing via in the first sub-area and in a corner region of the array substrate has an aperture size (e.g., an aperture width) is smaller than an aperture size (e.g., an aperture width) of at least a gas releasing via in the first sub-area in a non-corner region of the array substrate. Referring to FIG. 6 and FIG. 7, a gas releasing via grva in the first sub-area Sa1 and in a corner region (e.g., the first corner region CR1) of the array substrate has an aperture size smaller than an aperture size of a gas releasing via grv in the first sub-area Sa1 in a non-corner region (e.g., the first side-area PA1, the second side-area PA2, the third side-area PA3, or the fourth side-area PA4) of the array substrate. Referring to FIG. 8 and FIG. 7, a gas releasing via grvc in the first sub-area Sa1 and in a corner region (e.g., the third corner region CR3) of the array substrate has an aperture size smaller than an aperture size of a gas releasing via grvb in the first sub-area Sa1 in a non-corner region (e.g., the first side-area PA1, the second side-area PA2, the third side-area PA3, or the fourth side-area PA4) of the array substrate.

In some embodiments, a ratio of the aperture size (e.g., the aperture width) of the at least one gas releasing via in the first sub-area and in the corner region of the array substrate to the aperture size (e.g., the aperture width) of the at least one gas releasing via in the first sub-area in the non-corner region of the array substrate is in a range of 1:1.5 to 1:5.0, e.g., 1:1.5 to 1:2.0, 1:2.0 to 1:2.5, 1:2.5 to 1:3.0, 1:3.0 to 1:3.5, 1:3.5 to 1:4.0, 1:4.0 to 1:4.5, or 1:4.5 to 1:5.0. In some embodiments, the aperture size (e.g., the aperture width) of the at least one gas releasing via in the first sub-area and in the corner region of the array substrate is smaller than the aperture size (e.g., the aperture width) of the at least one gas releasing via in the first sub-area in the non-corner region of the array substrate by at least 5%, e.g., at least 10%, at least 15%, at least 20%, at least 25%, at least 30%, at least 35%, at least 400%, at least 45%, at least 50%, at least 55%, at least 60%, at least 65%, at least 700%, at least 75%, at least 80%, or at least 85%.

In some embodiments, at least one gas releasing via in the first sub-area and in a corner region connecting the second side-area and the fourth side-area or a corner region connecting the third side-area and the fourth side-area has an aperture size (e.g., an aperture width) smaller than an aperture size (e.g., an aperture width) of at least one gas releasing via in the first sub-area and in a corner region connecting the first side-area and the second side-area or a corner region connecting the first side-area and the third side-area. Referring to FIG. 6 and FIG. 8, a gas releasing via grva in the first sub-area Sa1 and in the first corner region CR1 (e.g., a corner region connecting the third side-area PA3 and the fourth side-area PA4) has an aperture size smaller than an aperture size of a gas releasing via grvc in the first sub-area Sa1 and in the third corner region CR3 (e.g., a corner region connecting the first side-area PA1 and the third side-area PA3).

In some embodiments, a ratio of the aperture size (e.g., the aperture width) of the at least one gas releasing via in the first sub-area and in the corner region connecting the second side-area and the fourth side-area or the corner region connecting the third side-area and the fourth side-area to the aperture size (e.g., the aperture width) of the at least one gas releasing via in the first sub-area and in the corner region connecting the first side-area and the second side-area or the corner region connecting the first side-area and the third side-area is in a range of 1:1.5 to 1:5.0. e.g., 1:1.5 to 1:2.0, 1:2.0 to 1:2.5, 1:2.5 to 1:3.0, 1:3.0 to 1:3.5, 1:3.5 to 1:4.0, 1:4.0 to 1:4.5, or 1:4.5 to 1:5.0. In some embodiments, the aperture size (e.g., the aperture width) of the at least one gas releasing via in the first sub-area and in the corner region connecting the second side-area and the fourth side-area or the corner region connecting the third side-area and the fourth side-area is smaller than the aperture size (e.g., the aperture width) of the at least one gas releasing via in the first sub-area and in the corner region connecting the first side-area and the second side-area or the corner region connecting the first side-area and the third side-area by at least 5%, e.g., at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, or at least 85%.

In some embodiments, the aperture size (e.g., the aperture width) of the at least one gas releasing via in the first sub-area and in a corner region connecting the first side-area and the second side-area or a corner region connecting the first side-area and the third side-area has an aperture size (e.g., an aperture width) smaller than an aperture size (e.g., an aperture width) of at least one gas releasing via in the first sub-area and in a non-corner region of the array substrate. Referring to FIG. 7 and FIG. 8, a gas releasing via in the first sub-area Sa1 and in the third corner region CR3 (e.g., a corner region connecting the first side-area PA1 and the third side-area PA3) has an aperture size smaller than an aperture size of a gas releasing via grvb in the first sub-area Sa1 and in the third side-area PA3 (e.g., a non-corner region of the array substrate).

In some embodiments, a ratio of the aperture size (e.g., the aperture width) of the at least one gas releasing via in the first sub-area and in the corner region connecting the first side-area and the second side-area or the corner region connecting the first side-area and the third side-area to the aperture size (e.g., the aperture width) of the at least one gas releasing via in the first sub-area and in the non-corner region of the array substrate is in a range of 1:1.5 to 1:5.0, e.g., 1:1.5 to 1:2.0, 1:2.0 to 1:2.5, 1:2.5 to 1:3.0, 1:3.0 to 1:3.5, 1:3.5 to 1:4.0, 1:4.0 to 1:4.5, or 1:4.5 to 1:5.0. In some embodiments, the aperture size (e.g., the aperture width) of the at least one gas releasing via in the first sub-area and in the corner region connecting the first side-area and the second side-area or the corner region connecting the first side-area and the third side-area is smaller than the aperture size (e.g., the aperture width) of the at least one gas releasing via in the first sub-area and in the non-corner region of the array substrate by at least 5%, e.g., at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, or at least 85%.

Figure 11A:
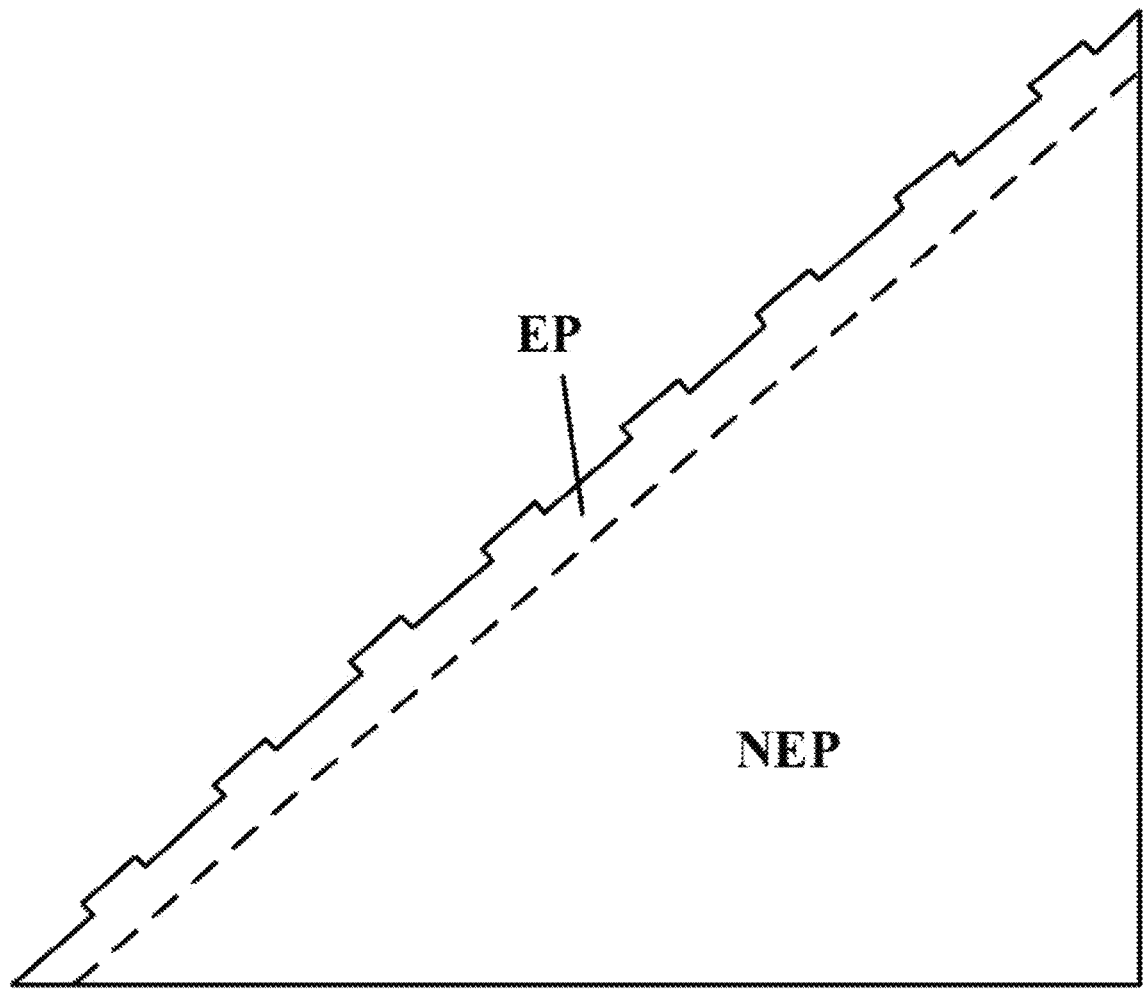
FIG. 11A illustrates an edge part and a non-edge part of a pixel definition layer depicted in FIG. 6.
Figure 11B:
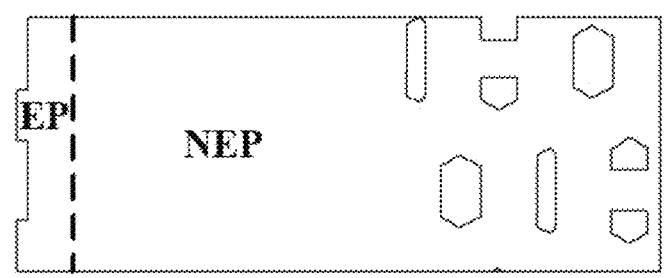
FIG. 11B illustrates an edge part and a non-edge part of a pixel definition layer depicted in FIG. 7.
Figure 11C:
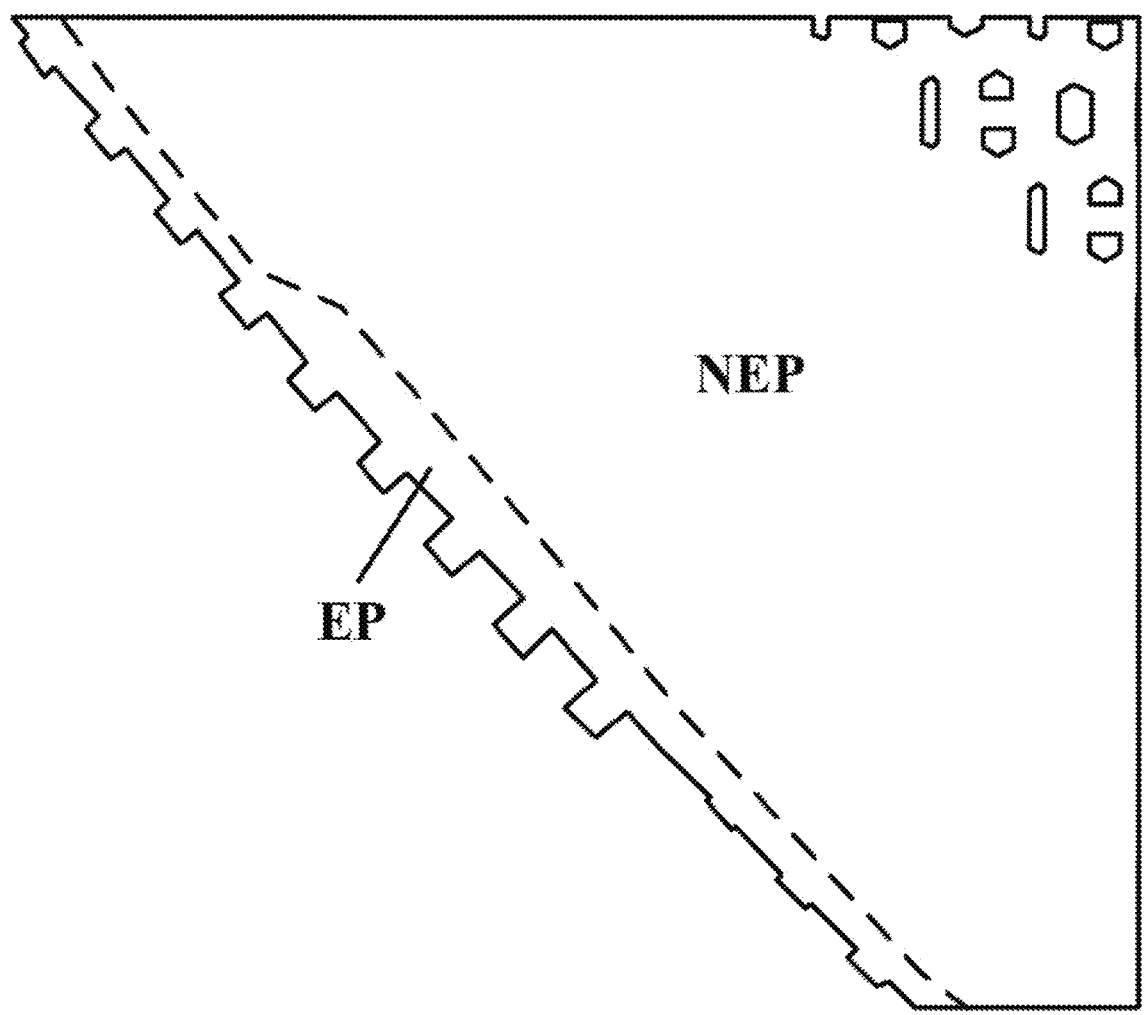
FIG. 11C illustrates an edge part and a non-edge part of a pixel definition layer depicted in FIG. 8.

FIG. 11A illustrates an edge part and a non-edge part of a pixel definition layer depicted in FIG. 6. FIG. 11B illustrates an edge part and a non-edge part of a pixel definition layer depicted in FIG. 7. FIG. 11C illustrates an edge part and a non-edge part of a pixel definition layer depicted in FIG. 8. Referring to FIG. 6 to FIG. 8, FIG. 9A to FIG. 9C, and FIG. 11A to FIG. 11C, the pixel definition layer PDL includes an edge part EP bordering the first sub-area Sa1, and a non-edge part NEP on a side of the edge part EP away from the first sub-area Sa1. The edge part EP spaces apart the non-edge part NEP from the first sub-area Sa1.

The inventors of the present disclosure further discover that regions proximal to the edge part of the pixel definition layer are regions where edges of anode material layer along the aperture of the gas releasing vias are prone to be exposed. The inventors of the present disclosure discover that, in these regions, an alignment between the pixel definition material layer (including the plurality of via blocks and the pixel definition layer) and the anode material layer cannot be maintained with high precision, as compared to other regions of the peripheral area. As a result of misalignment, edges of the anode material layer along the aperture of the gas releasing vias are prone to be exposed.

Accordingly, in some embodiments, at least one gas releasing via underneath an edge part of the pixel definition layer bordering the first sub-area has an aperture size (e.g., an aperture width) smaller than an aperture size (e.g., an aperture width) of at least one gas releasing via in the first sub-area, and smaller than an aperture size (e.g., an aperture width) of at least one gas releasing via underneath a non-edge part of the pixel definition layer. Referring to FIG. 6, in the first corner region CR1, at least a gas releasing via grvs1 underneath an edge part EP of the pixel definition layer PDL bordering the first sub-area Sa1 has an aperture size smaller than an aperture size of at least a gas releasing via grva in the first sub-area Sa1, and smaller than an aperture size of at least a gas releasing via grvr underneath a non-edge part NEP of the pixel definition layer PDL. Optionally, the second corner region (CR2 in FIG. 5) has a layout similar to that of the first corner region CR1, optionally with a mirror symmetry with respect to each other. Optionally, in the second corner region CR2, at least a gas releasing via underneath an edge part EP of the pixel definition layer PDL bordering the first sub-area Sa1 has an aperture size smaller than an aperture size of at least a gas releasing via in the first sub-area Sa1, and smaller than an aperture size of at least a gas releasing via underneath a non-edge part NEP of the pixel definition layer PDL.

In some embodiments, a ratio of the aperture size (e.g., the aperture width) of the at least one gas releasing via underneath the edge part of the pixel definition layer bordering the first sub-area to the aperture size (e.g., the aperture width) of the at least one gas releasing via in the first sub-area is in a range of 1:1.5 to 1:5.0, e.g., 1:1.5 to 1:2.0, 1:2.0 to 1:2.5, 1:2.5 to 1:3.0, 1:3.0 to 1:3.5, 1:3.5 to 1:4.0, 1:4.0 to 1:4.5, or 1:4.5 to 1:5.0. In some embodiments, the aperture size (e.g., the aperture width) of the at least one gas releasing via underneath the edge part of the pixel definition layer bordering the first sub-area is smaller than the aperture size (e.g., the aperture width) of the at least one gas releasing via in the first sub-area by at least 5%, e.g., at least 10%, at least 15%, at least 20%, at least 25%, at least 30%, at least 35%, at least 40%, at least 45%, at least 50%, at least 55%, at least 600%, at least 65%, at least 70%, at least 75%, at least 80%, or at least 85%.

In some embodiments, a ratio of the aperture size (e.g., the aperture width) of the at least one gas releasing via underneath the edge part of the pixel definition layer bordering the first sub-area to the aperture size (e.g., the aperture width) of the at least one gas releasing via underneath the non-edge part of the pixel definition layer is in a range of 1:1.5 to 1:5.0, e.g., 1:1.5 to 1:2.0, 1:2.0 to 1:2.5, 1:2.5 to 1:3.0, 1:3.0 to 1:3.5, 1:3.5 to 1:4.0, 1:4.0 to 1:4.5, or 1:4.5 to 1:5.0. In some embodiments, the aperture size (e.g., the aperture width) of the at least one gas releasing via underneath an edge part of the pixel definition layer bordering the first sub-area is smaller than the aperture size (e.g., the aperture width) of the at least one gas releasing via underneath the non-edge part of the pixel definition layer by at least 5%, e.g., at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, or at least 85%.

Referring to FIG. 7, in the third side-area PA3, at least a gas releasing via grvs1 underneath an edge part EP of the pixel definition layer PDL bordering the first sub-area Sa1 has an aperture size (e.g., an aperture width) smaller than an aperture size (e.g., an aperture width) of at least a gas releasing via grvb in the first sub-area Sa1, and smaller than an aperture size of at least a gas releasing via grvr underneath a non-edge part NEP of the pixel definition layer PDL. Optionally, the first side-area (PA1 in FIG. 5), the second side-area (PA2 in FIG. 5), and the fourth side-area (PA4 in FIG. 5) are all non-corner regions, and have a layout similar to that of the third side-area PA3. Optionally, in the first side-area PA1, at least a gas releasing via underneath an edge part EP of the pixel definition layer PDL bordering the first sub-area Sa1 has an aperture size smaller than an aperture size of at least a gas releasing via in the first sub-area Sa1, and smaller than an aperture size of at least a gas releasing via underneath a non-edge part NEP of the pixel definition layer PDL. Optionally, in the second side-area PA2, at least a gas releasing via underneath an edge part EP of the pixel definition layer PDL bordering the first sub-area Sa1 has an aperture size smaller than an aperture size of at least a gas releasing via in the first sub-area Sa1, and smaller than an aperture size of at least a gas releasing via underneath a non-edge part NEP of the pixel definition layer PDL.

Optionally, in the fourth side-area PA4, at least a gas releasing via underneath an edge part EP of the pixel definition layer PDL bordering the first sub-area Sa1 has an aperture size smaller than an aperture size of at least a gas releasing via in the first sub-area Sa1, and smaller than an aperture size of at least a gas releasing via underneath a non-edge part NEP of the pixel definition layer PDL.

Referring to FIG. 8, in the third corner region CR3, at least a gas releasing via grvs1 underneath an edge part EP of the pixel definition layer PDL bordering the first sub-area Sa1 has an aperture size (e.g., an aperture width) smaller than an aperture size (e.g., an aperture width) of at least a gas releasing via grvc in the first sub-area Sa1, and smaller than an aperture size of at least a gas releasing via grvr underneath a non-edge part NEP of the pixel definition layer PDL. Optionally, the fourth corner region (CR4 in FIG. 5) has a layout similar to that of the third corner region CR3, optionally with a mirror symmetry with respect to each other. Optionally, in the fourth corner region CR4, at least a gas releasing via underneath an edge part EP of the pixel definition layer PDL bordering the first sub-area Sa1 has an aperture size smaller than an aperture size of at least a gas releasing via in the first sub-area Sa1, and smaller than an aperture size of at least a gas releasing via underneath a non-edge part NEP of the pixel definition layer PDL.

In some embodiments, at least one gas releasing via in the first sub-area bordering an edge part of the pixel definition layer has an aperture size (e.g., an aperture width) smaller than an aperture size (e.g., an aperture width) of at least another gas releasing via in the first sub-area spaced apart from the edge part by the at least one gas releasing via. Referring to FIG. 8, in the third corner region CR3, at least a gas releasing via grvs2 in the first sub-area bordering an edge part EP of the pixel definition layer PDL has an aperture size smaller than an aperture size of at least a gas releasing via grvc in the first sub-area Sa1. The gas releasing via grvc is spaced apart from the edge part EP by the gas releasing via grvs2.

In some embodiments, a ratio of the aperture size (e.g., the aperture width) of the at least one gas releasing via in the first sub-area bordering the edge part of the pixel definition layer to the aperture size (e.g., the aperture width) of the at least another gas releasing via in the first sub-area spaced apart from the edge part by the at least one gas releasing via is in a range of 1:1.5 to 1:5.0, e.g., 1:1.5 to 1:2.0, 1:2.0 to 1:2.5, 1:2.5 to 1:3.0, 1:3.0 to 1:3.5, 1:3.5 to 1:4.0, 1:4.0 to 1:4.5, or 1:4.5 to 1:5.0. In some embodiments, the aperture size (e.g., the aperture width) of the at least one gas releasing via in the first sub-area bordering the edge part of the pixel definition layer is smaller than the aperture size (e.g., the aperture width) of the at least another gas releasing via in the first sub-area spaced apart from the edge part by the at least one gas releasing via by at least 5%, e.g., at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, or at least 85%.

In some embodiments, a first ratio of a first width of a first respective via block to a first aperture width of a first respective gas releasing via in the first region is greater than a second ratio of a second width of a second respective via block to a second aperture width of a second respective gas releasing via in the second region. Referring to FIG. 4, a first ratio of a first width W1 of a first respective via block RVB1 to a first aperture width AP1 of a first respective gas releasing via rgrv1 in the first region R1 is greater than a second ratio of a second width W2 of a second respective via block RVB2 to a second aperture width AP2 of a second respective gas releasing via rgrv2 in the second region R2.

In some embodiments, the first width W1 and the second width W2 are substantially the same. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value. Optionally, the first aperture width AP1 is smaller than the second aperture width AP2.

Referring to FIG. 6 to FIG. 8, in some embodiments, the plurality of via blocks in FIG. 6, FIG. 7, and FIG. 8 have a substantially the same width. In one example, a first ratio of a first width of a first respective via block to a first aperture width of a first respective gas releasing via in a corner region (e.g., the first corner region CR1 in FIG. 6 or the third corner region CR3 in FIG. 8) is greater than a second ratio of a second width of a second respective via block to a second aperture width of a second respective gas releasing via in a non-corner region (e.g., the third side-area PA3 in FIG. 7).

In another example, a first ratio of a first width of a first respective via block to a first aperture width of a first respective gas releasing via in a corner region connecting the second side-area and the fourth side-area or a corner region connecting the third side-area and the fourth side-area (e.g., the first corner region CR1 in FIG. 6 or the third corner region CR3 in FIG. 8) is greater than a second ratio of a second width of a second respective via block to a second aperture width of a second respective gas releasing via in a corner region connecting the first side-area and the second side-area or a corner region connecting the first side-area and the third side-area (e.g., the third corner region CR3 in FIG. 8).

Optionally, the first ratio is greater than the second ratio by 25% to 250%, e.g., by 25% to 35%, 35% to 45%, 45% to 55%, 55% to 65%, 65% to 75%, 75% to 85%, 85% to 95%, 95% to 105%, 105% to 115%, 115% to 125%, 125% to 135%, 135% to 145%, 145% to 155%, 155% to 165%, 165% to 175%, 175% to 185%, 185% to 195%, 195% to 205%, 205% to 215%, 215% to 225%, 225% to 235%, 235% to 245%, or 245% to 250%.

In some embodiments, a ratio of the aperture size (e.g., the aperture width) of the first respective gas releasing via in the first region to the aperture size (e.g., the aperture width) of the second respective gas releasing via in the second region is in a range of 1:1.5 to 1:5.0, e.g., 1:1.5 to 1:2.0, 1:2.0 to 1:2.5, 1:2.5 to 1:3.0, 1:3.0 to 1:3.5, 1:3.5 to 1:4.0, 1:4.0 to 1:4.5, or 1:4.5 to 1:5.0.

Optionally, the gas releasing via grvr in FIG. 6 to FIG. 8 has an aperture width in a range of 10.5 µm to 18.5 µm, e.g., 10.5 µm to 11.5 µm, 11.5 µm to 12.5 µm, 12.5 µm to 13.5 µm, 13.5 µm to 14.5 µm, 14.5 µm to 15.5 µm, 15.5 µm to 16.5 µm, 16.5 µm to 17.5 µm, or 17.5 µm to 18.5 µm. In one example, the gas releasing via grvr in FIG. 6 to FIG. 8 has an aperture width of 14.5 µm.

Optionally, the gas releasing via grva in FIG. 6 has an aperture width in a range of 3.5 µm to 10.5 µm, e.g., 3.5 µm to 4.5 µm, 4.5 µm to 5.5 µm, 5.5 µm to 6.5 µm, 6.5 µm to 7.5 µm, 7.5 µm to 8.5 µm, 8.5 µm to 9.5 µm, or 9.5 µm to 10.5 µm. In one example, the gas releasing via grva in FIG. 7 has an aperture width of 7.5 µm.

Optionally, the gas releasing via grvb in FIG. 7 has an aperture width in a range of 10.5 µm to 18.5 µm, e.g., 10.5 µm to 11.5 µm, 11.5 µm to 12.5 µm, 12.5 µm to 13.5 µm, 13.5 µm to 14.5 µm, 14.5 µm to 15.5 µm, 15.5 µm to 16.5 µm, 16.5 µm to 17.5 µm, or 17.5 µm to 18.5 µm. In one example, the gas releasing via grvb in FIG. 7 has an aperture width of 14.5 µm.

Optionally, the gas releasing via grvs1 in FIG. 6 to FIG. 8 has an aperture width in a range of 3.5 µm to 10.5 µm. e.g., 3.5 µm to 4.5 µm, 4.5 µm to 5.5 µm, 5.5 µm to 6.5 µm, 6.5 µm to 7.5 µm, 7.5 µm to 8.5 µm, 8.5 µm to 9.5 µm, or 9.5 µm to 10.5 µm. In one example, the gas releasing via grvs1 in FIG. 6 to FIG. 8 has an aperture width of 7.5 µm.

Optionally, the gas releasing via grvs2 in FIG. 8 has an aperture width in a range of 3.5 µm to 10.5 µm, e.g., 3.5 µm to 4.5 µm, 4.5 µm to 5.5 µm, 5.5 µm to 6.5 µm, 6.5 µm to 7.5 µm, 7.5 µm to 8.5 µm, 8.5 µm to 9.5 µm, or 9.5 µm to 10.5 µm. In one example, the gas releasing via grvs2 in FIG. 8 has an aperture width of 7.5 µm.

In some embodiments, the array substrate includes a peripheral voltage supply line in the peripheral area. The anode material layer is a layer of the peripheral voltage supply line. In one example, the peripheral voltage supply line is a signal line (e.g., a low voltage signal line) configured to provide a voltage signal (e.g., a Vss signal) to a cathode of a light emitting element in a display area of the array substrate.

Figure 12A:
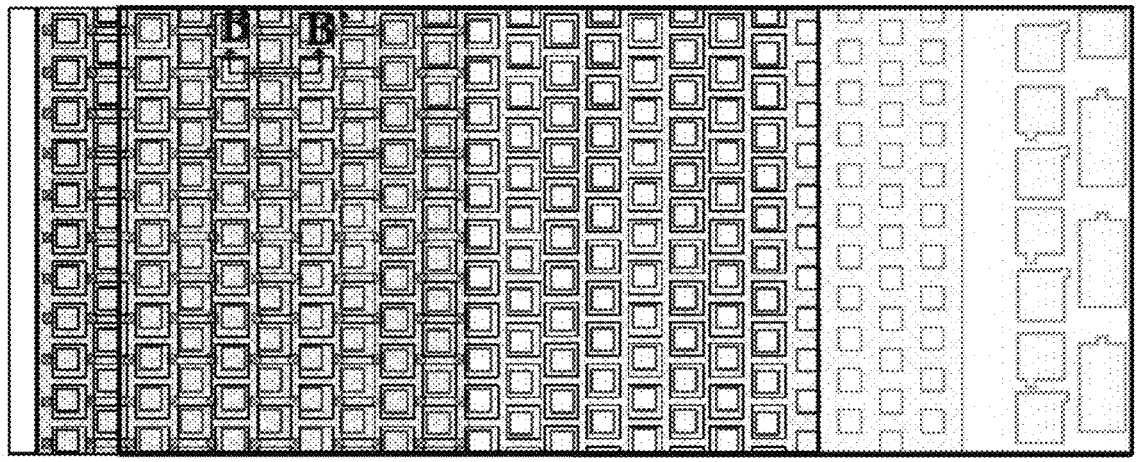
FIG. 12A is a schematic diagram illustrating the structure of selected layers in a peripheral area of an array substrate in some embodiments according to the present disclosure.
Figure 12B:
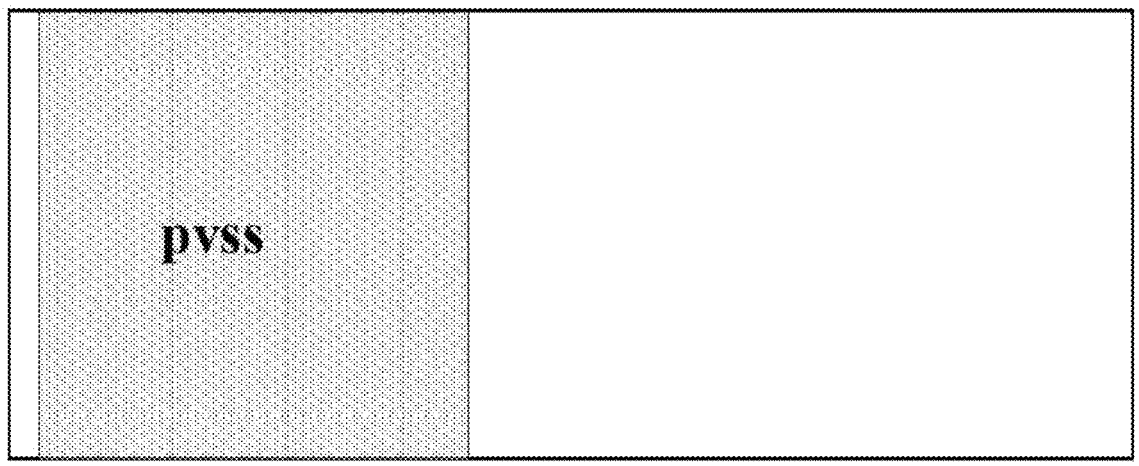
FIG. 12B is a schematic diagram illustrating the structure of a signal line material layer in FIG. 12A.
Figure 12C:
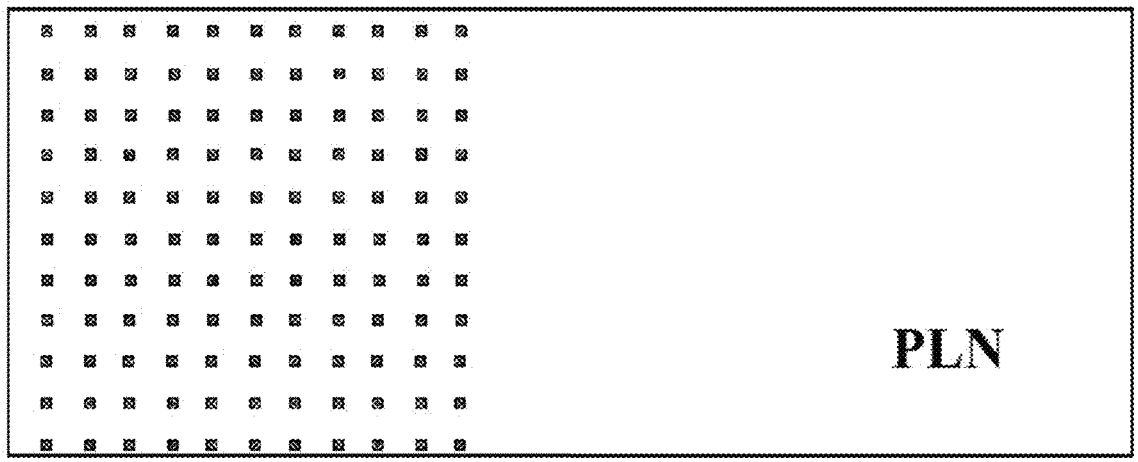
FIG. 12C is a schematic diagram illustrating the structure of a planarization layer in FIG. 12A.
Figure 12D:
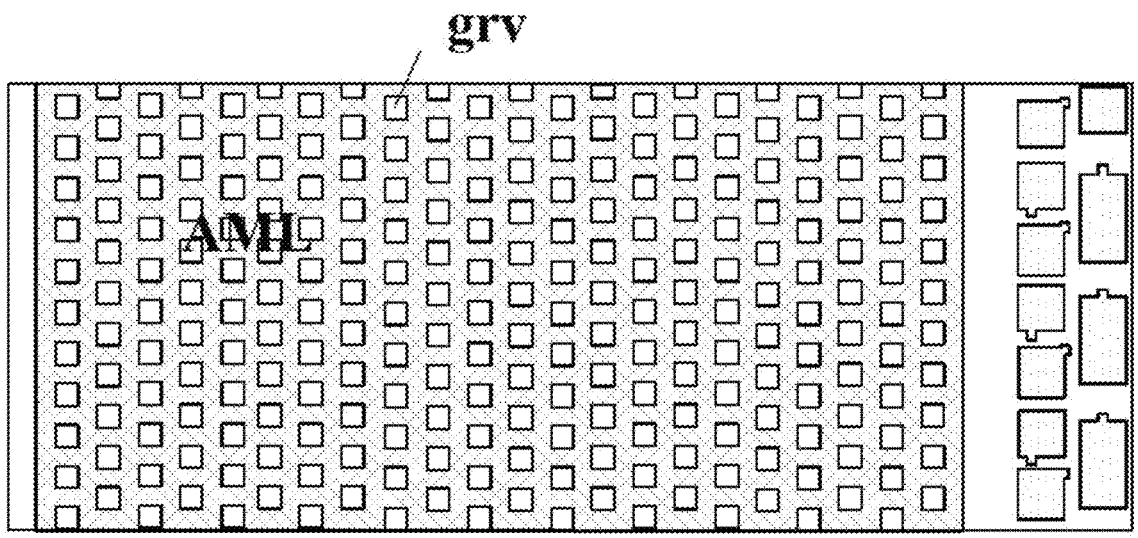
FIG. 12D is a schematic diagram illustrating the structure of an anode material layer in FIG. 12A.
Figure 12E:
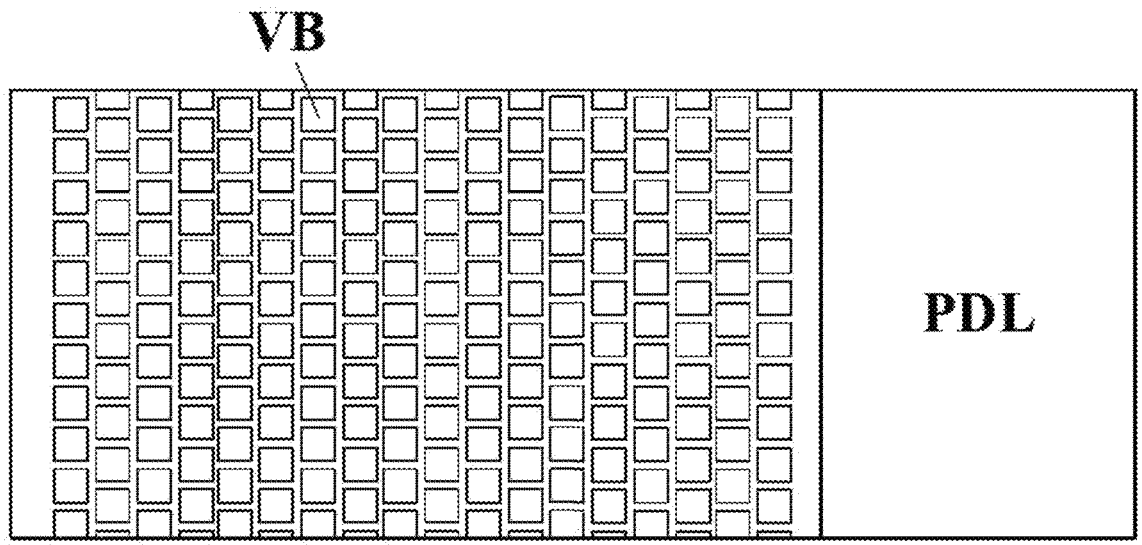
FIG. 12E is a schematic diagram illustrating the structure of a pixel definition material layer in FIG. 12A.
Figure 12F:
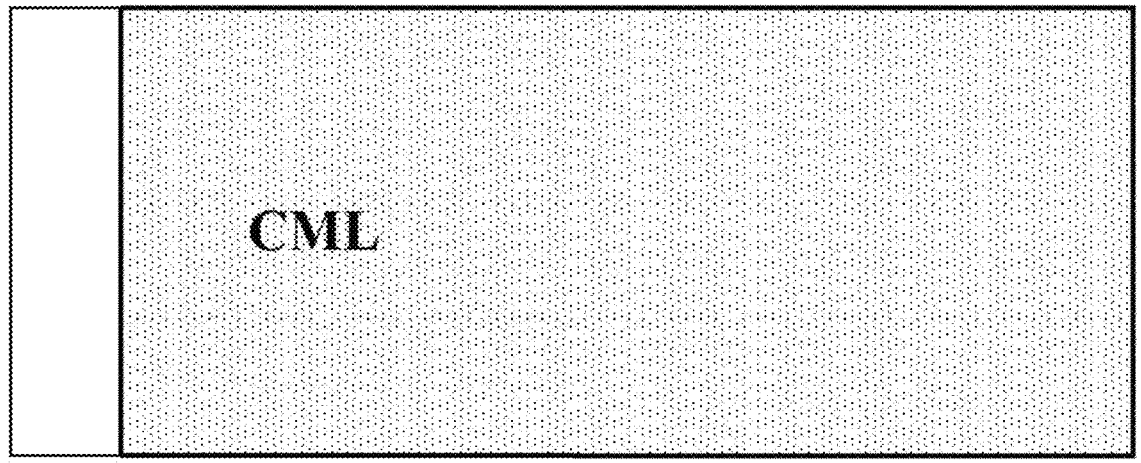
FIG. 12F is a schematic diagram illustrating the structure of a cathode material layer in FIG. 12A.
Figure 12G:
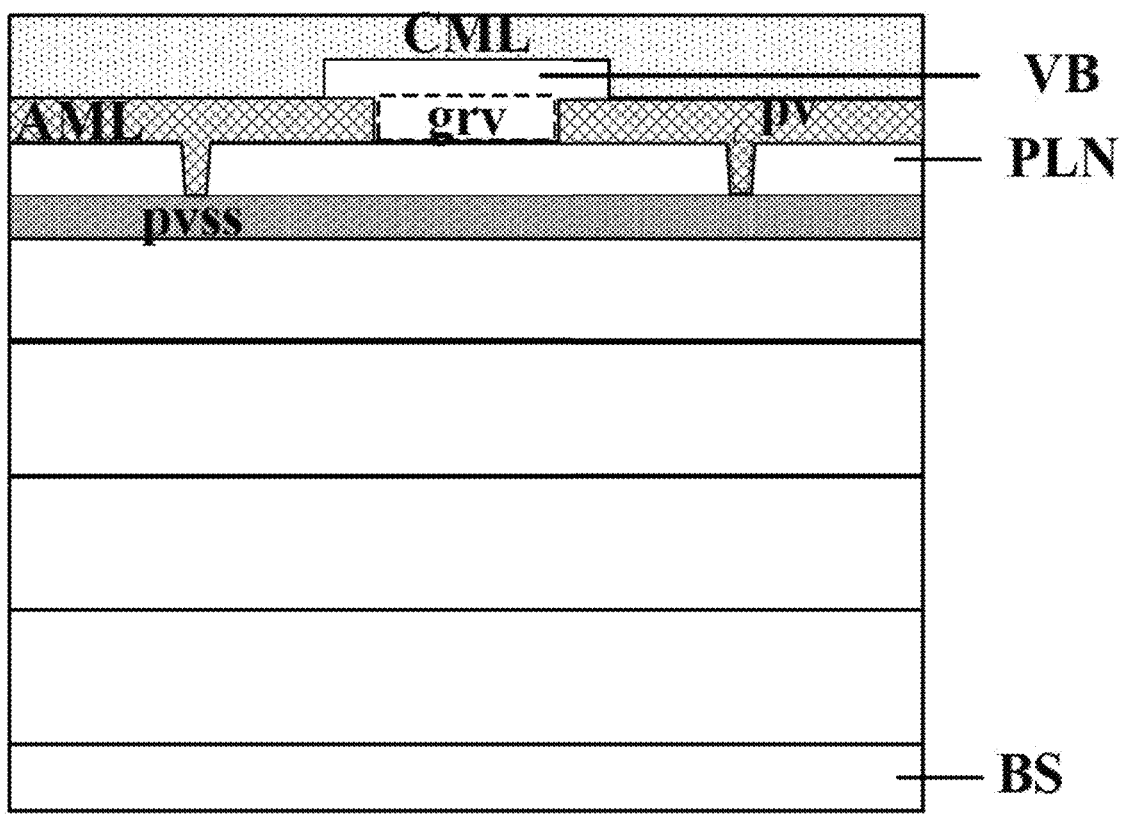
FIG. 12G is a cross-sectional view along a B-B' line in FIG. 12A.

FIG. 12A is a schematic diagram illustrating the structure of selected layers in a peripheral area of an array substrate in some embodiments according to the present disclosure. FIG. 12B is a schematic diagram illustrating the structure of a signal line material layer in FIG. 12A. FIG. 12C is a schematic diagram illustrating the structure of a planarization layer in FIG. 12A. FIG. 12D is a schematic diagram illustrating the structure of an anode material layer in FIG. 12A. FIG. 12E is a schematic diagram illustrating the structure of a pixel definition material layer in FIG. 12A. FIG. 12F is a schematic diagram illustrating the structure of a cathode material layer in FIG. 12A. FIG. 12G is a cross-sectional view along a B-B' line in FIG. 12A. FIG. 12A to FIG. 12G illustrate the structure of layers in a peripheral area of an array substrate where a gate-on-array is not present. Referring to FIG. 12A to FIG. 12G, in some embodiments, the peripheral voltage supply line further includes a cathode material layer CML in the peripheral area and on a side of the pixel definition material layer (e.g., on a side of the plurality of via blocks VB) and the anode material layer AML away from the planarization layer PLN. The cathode material layer CML is connected to the anode material layer AML.

In some embodiments, as shown in FIG. 12F and FIG. 9A to FIG. 9C, the cathode material layer CML is at least partially present in the first sub-area Sa1 and at least partially absent in the second sub-area Sa2. Optionally, the cathode material layer CML is at least partially present in the first sub-area Sa1 and is completely absent in the second sub-area Sa2.

In some embodiments, the peripheral voltage supply line further includes a signal line material layer pvss on a side of the planarization layer PLN away from the anode material layer AML. For example, the planarization layer PLN is between the signal line material layer pvss and the anode material layer AML. The anode material layer AML is connected to the signal line material layer pvss through one or more peripheral vias pv in the peripheral area and extending through the planarization layer PLN.

Figure 13A:
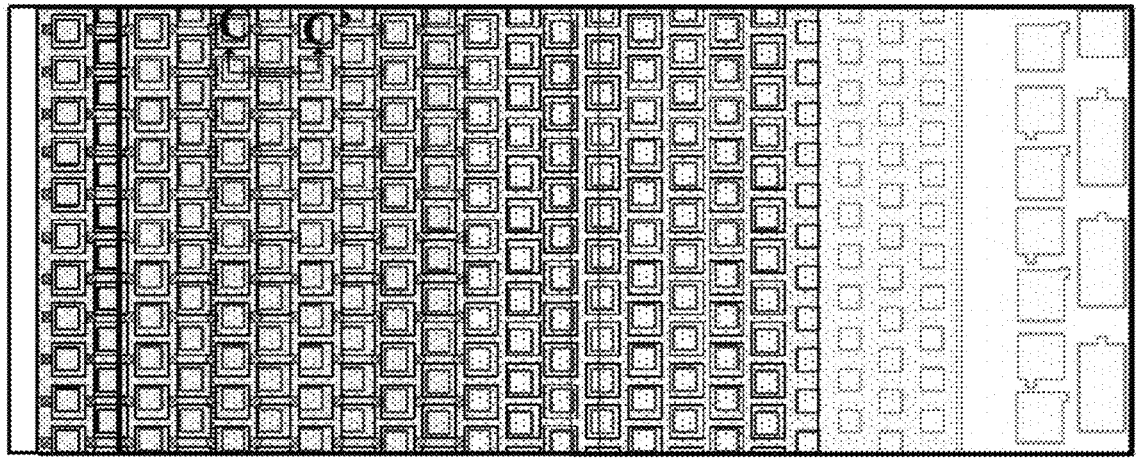
FIG. 13A is a schematic diagram illustrating the structure of selected layers in a peripheral area of an array substrate in some embodiments according to the present disclosure.
Figure 13B:
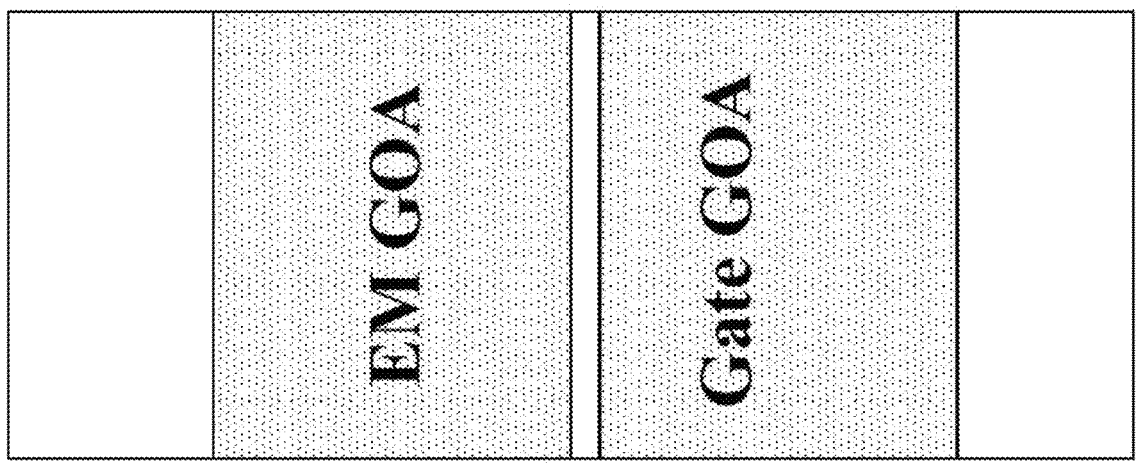
FIG. 13B is a schematic diagram illustrating the structure of a gate on array in FIG. 13A.
Figure 13C:
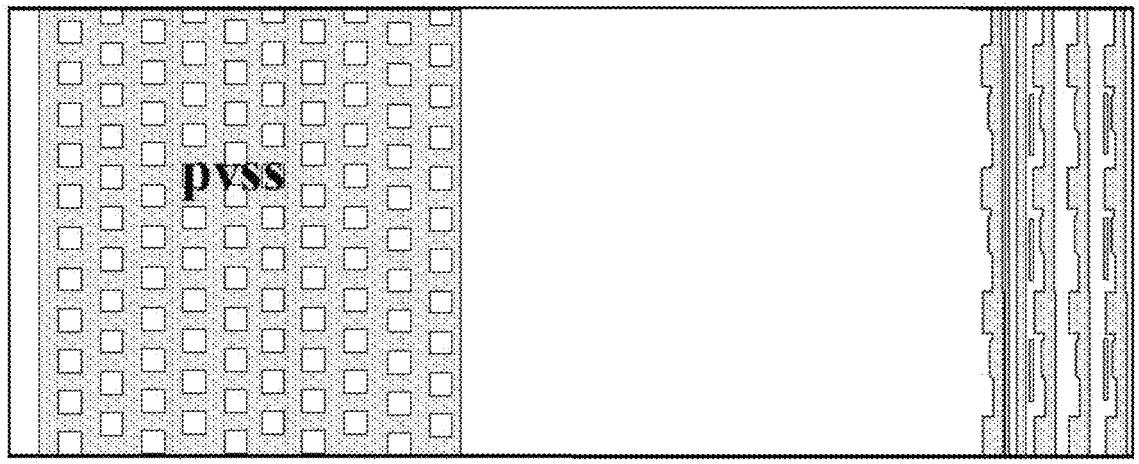
FIG. 13C is a schematic diagram illustrating the structure of a signal line material layer in FIG. 13A.
Figure 13D:
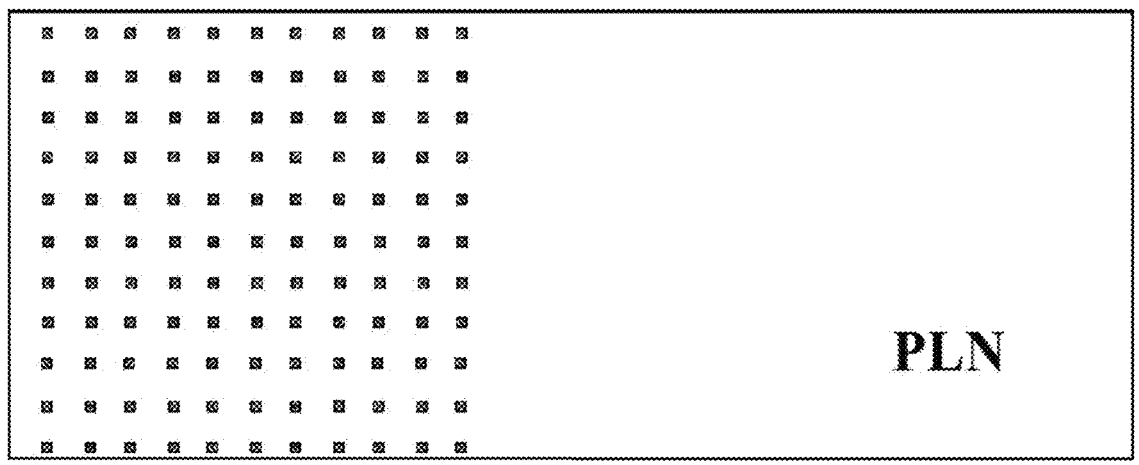
FIG. 13D is a schematic diagram illustrating the structure of a planarization layer in FIG. 13A.
Figure 13E:
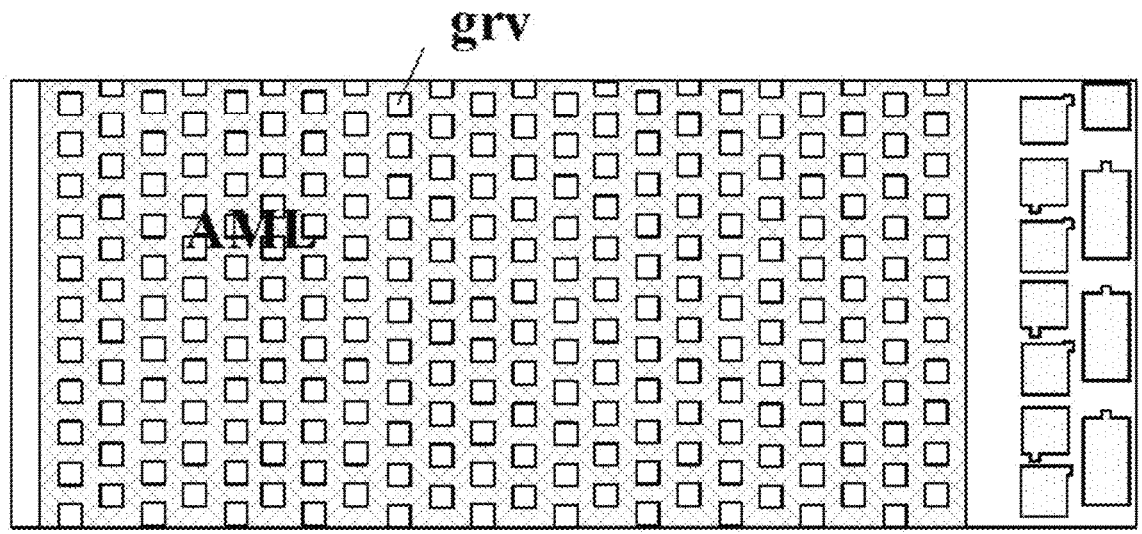
FIG. 13E is a schematic diagram illustrating the structure of an anode material layer in FIG. 13A.
Figure 13F:
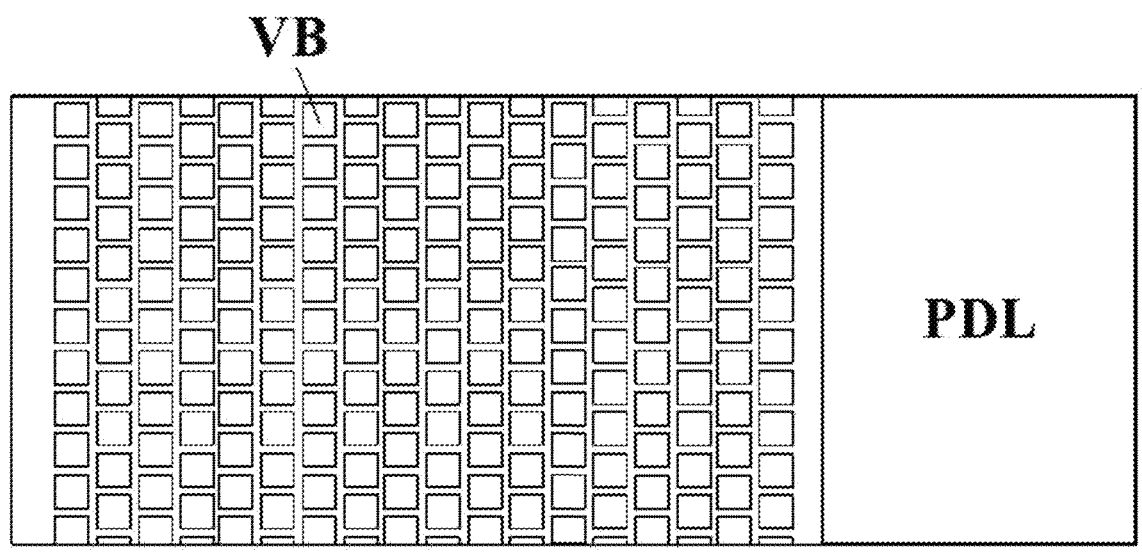
FIG. 13F is a schematic diagram illustrating the structure of a pixel definition material layer in FIG. 13A.
Figure 13G:
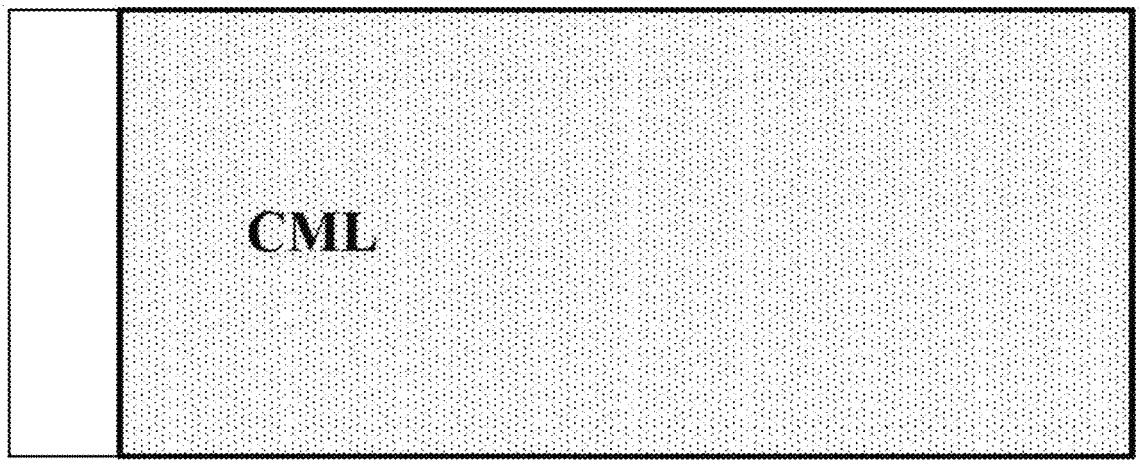
FIG. 13G is a schematic diagram illustrating the structure of a cathode material layer in FIG. 13A.
Figure 13H:
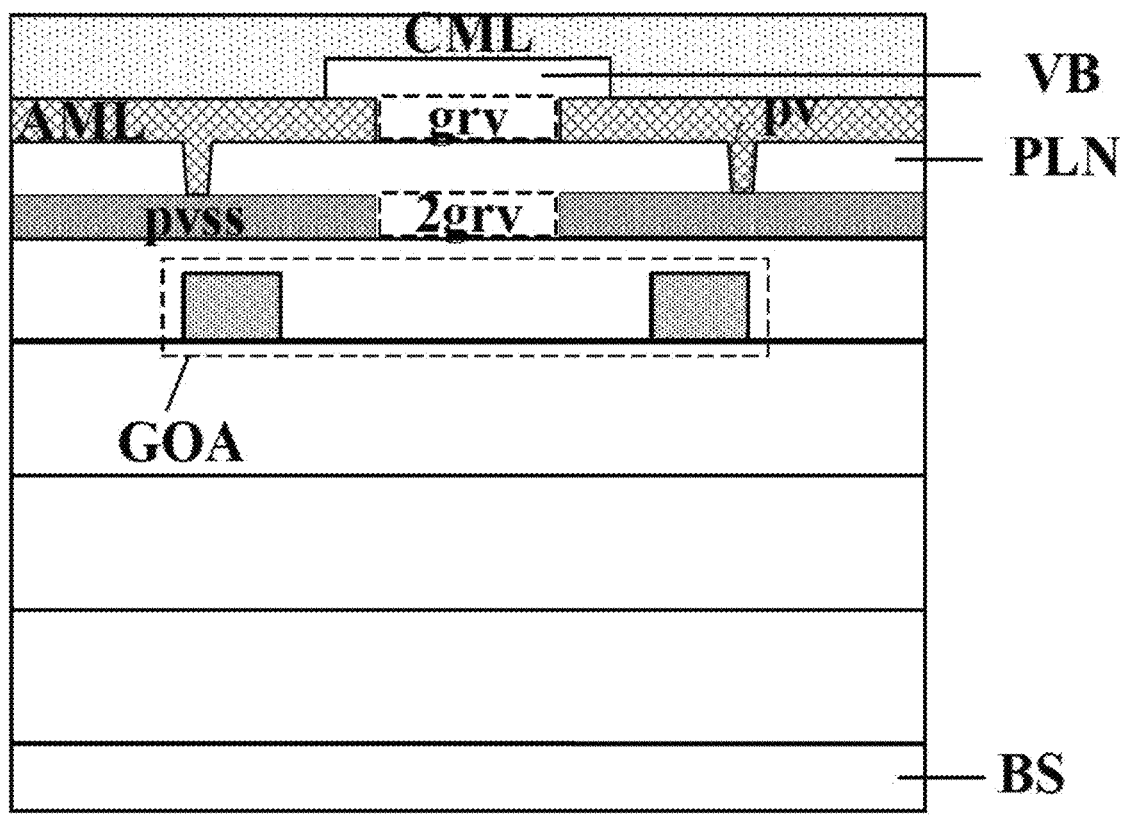
FIG. 13H is a cross-sectional view along a C-C' line in FIG. 13A.

FIG. 13A is a schematic diagram illustrating the structure of selected layers in a peripheral area of an array substrate in some embodiments according to the present disclosure. FIG. 13B is a schematic diagram illustrating the structure of a gate on array in FIG. 13A. FIG. 13C is a schematic diagram illustrating the structure of a signal line material layer in FIG. 13A. FIG. 13D is a schematic diagram illustrating the structure of a planarization layer in FIG. 13A. FIG. 13E is a schematic diagram illustrating the structure of an anode material layer in FIG. 13A. FIG. 13F is a schematic diagram illustrating the structure of a pixel definition material layer in FIG. 13A. FIG. 13G is a schematic diagram illustrating the structure of a cathode material layer in FIG. 13A. FIG. 13H is a cross-sectional view along a C-C' line in FIG. 13A. FIG. 13A to FIG. 13H illustrate the structure of layers in a peripheral area of an army substrate where a gate-on-array is present.

Referring to FIG. 13A to FIG. 13H, the army substrate in the peripheral area includes one or more gate-on-array circuits (e.g., a Gate GOA and an EM GOA as shown in FIG. 13B) on a base substrate BS, a signal line material layer pvss on a side of the one or more gate-on-array circuits away from the base substrate BS, a planarization layer PLN on a side of the signal line material layer pvss away from the one or more gate-on-array circuits, an anode material layer AML on a side of the planarization layer PLN away from the signal line material layer pvss, a plurality of via blocks VB on a side of the anode material layer AML away from the planarization layer PLN, and a cathode material layer CML on a side of the plurality of via blocks VB away from the anode material layer AML. The anode material layer AML is connected to the signal line material layer pvss through one or more peripheral vias pv in the peripheral area and extending through the planarization layer PLN.

In some embodiments, the array substrate further includes a plurality of second gas releasing vias 2grv extending through the signal line material layer pvss for releasing gas in an insulating layer underneath the signal line material layer pvss during a fabrication process. As shown in FIG. 13H, in some embodiments, an orthographic projection of a second gas releasing via 2grv in the signal line material layer pvss on the base substrate BS at least partially overlaps with an orthographic projection of a gas releasing via grv in the anode material layer AML on the base substrate BS.

Figure 13I:
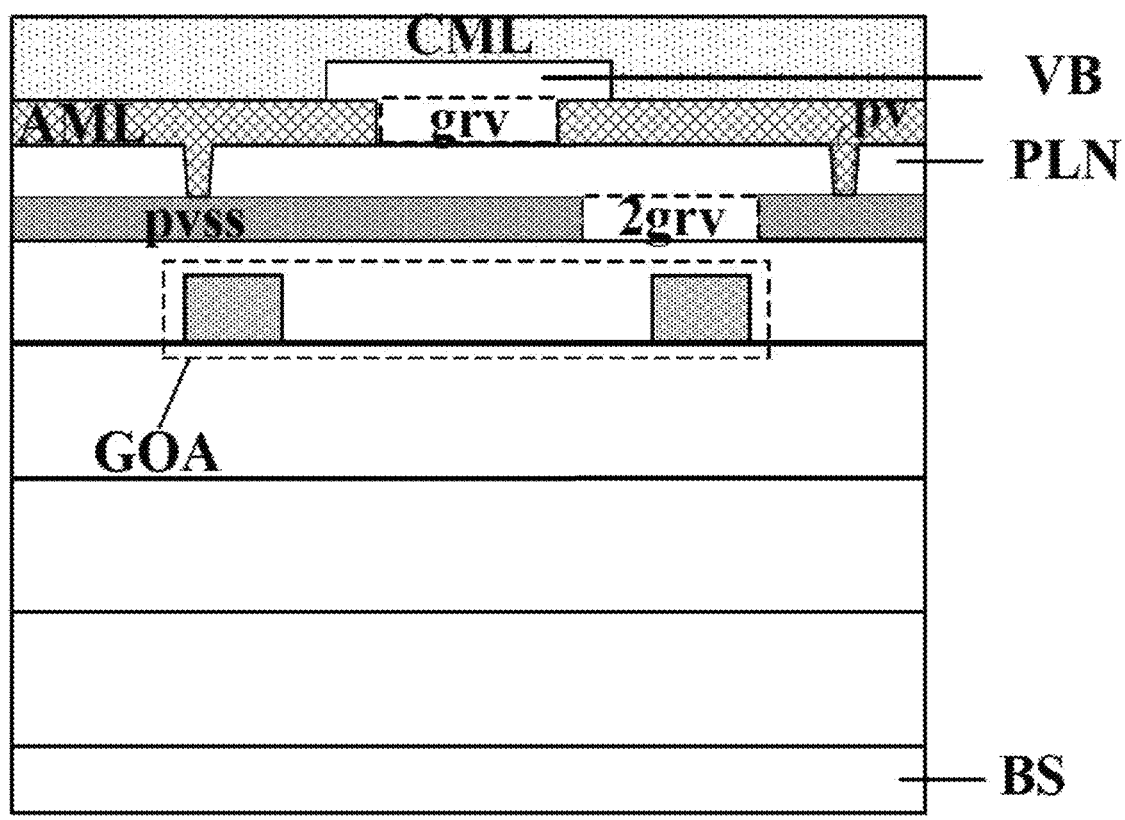
FIG. 13I is a cross-sectional view of an array substrate in some embodiments according to the present disclosure.

FIG. 13I is a cross-sectional view of an array substrate in some embodiments according to the present disclosure. Referring to FIG. 13I, in some embodiments, an orthographic projection of a second gas releasing via 2grv in the signal line material layer pvss on the base substrate BS is at least partially non-overlapping with an orthographic projection of a gas releasing via grv in the anode material layer AML on the base substrate BS.

In the embodiments depicted in FIG. 4, FIG. 6 to FIG. 7, gas releasing vias in an anode material layer AML have non-uniform aperture sizes in different regions of the peripheral area PA. The inventors of the present disclosure discover that, as an alternative solution to the electrostatic discharge damage issue, the gas releasing vias in an anode material layer AML may have uniform aperture sizes throughout the peripheral area PA. In the alternative solution, the plurality of via blocks VB on the anode material layer AML may be made to have non-uniform widths in different regions of the peripheral area PA. In the problematic regions such as the first corner region CR1 and/or the second corner region CR2, and regions proximal to the edge part of the pixel definition layer, via blocks may be made to have a larger width. In the non-corner regions, via blocks may be made to have a smaller width.

Figure 14:
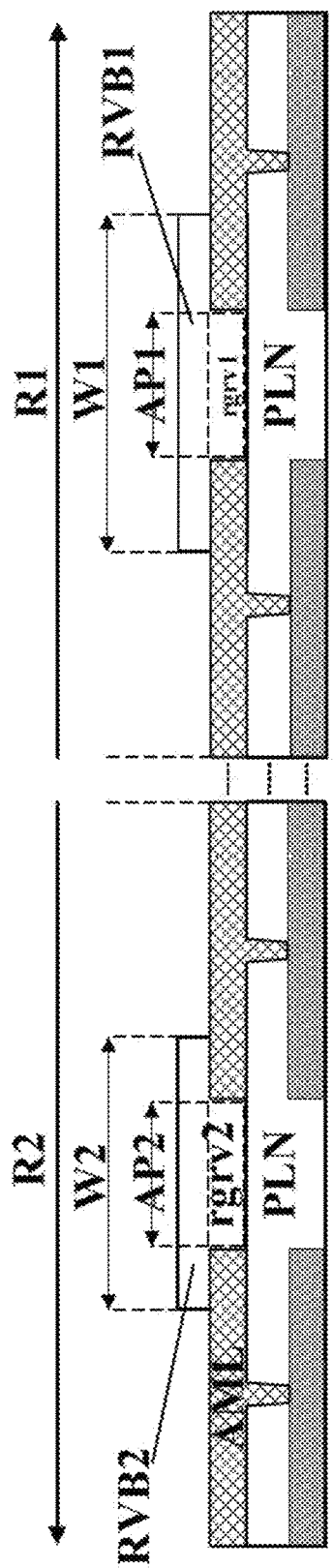
FIG. 14 illustrates the structure of selected layers in a first region and a second region of a peripheral area of an array substrate in some embodiments according to the present disclosure.

FIG. 14 illustrates the structure of selected layers in a first region and a second region of a peripheral area of an array substrate in some embodiments according to the present disclosure. Referring to FIG. 14, the peripheral area of the array substrate includes a first region R1 and a second region R2. In the first region R1, a first respective gas releasing via rgrv1 has a first aperture width AP1. In the second region R2, a second respective gas releasing via rgrv2 has a second aperture width AP2. Optionally, the first aperture width AP1 is substantially the same as the second aperture width AP2. In the first region R1, a first respective via block RVB1 has a first width W1. In the second region R2, a second respective via block RVB2 has a second width W2. Optionally, the first width W1 is greater than the second width W1. Optionally, a first ratio of a first width W1 of a first respective via block RVB1 to a first aperture width AP1 of a first respective gas releasing via rgrv1 in the first region R1 is greater than a second ratio of a second width W2 of a second respective via block RVB2 to a second aperture width AP2 of a second respective gas releasing via rgrv2 in the second region R2.

The inventors of the present disclosure discover that, as another alternative solution to the electrostatic discharge damage issue, the gas releasing vias in an anode material layer AML may have uniform aperture sizes throughout the peripheral area PA. In the another alternative solution, the plurality of via blocks VB on the anode material layer AML may be made to have non-uniform thicknesses in different regions of the peripheral area PA. In the problematic regions such as the first corner region CR1 and/or the second corner region CR2, and regions proximal to the edge part of the pixel definition layer, via blocks may be made to have a larger thickness. In the non-corner regions, via blocks may be made to have a smaller thickness.

Figure 15:
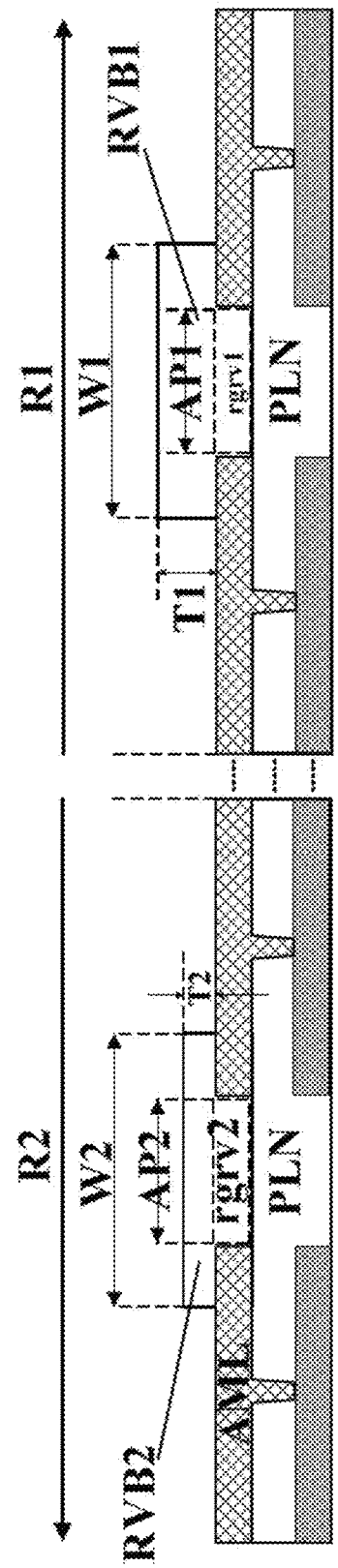
FIG. 15 illustrates the structure of selected layers in a first region and a second region of a peripheral area of an array substrate in some embodiments according to the present disclosure.

FIG. 15 illustrates the structure of selected layers in a first region and a second region of a peripheral area of an array substrate in some embodiments according to the present disclosure. Referring to FIG. 15, the peripheral area of the array substrate includes a first region R1 and a second region R2. In the first region R1, a first respective gas releasing via rgrv1 has a first aperture width AP1. In the second region R2, a second respective gas releasing via rgrv2 has a second aperture width AP2. Optionally, the first aperture width AP1 is substantially the same as the second aperture width AP2. In the first region R1, a first respective via block RVB1 has a first thickness T1. In the second region R2, a second respective via block RVB2 has a second thickness T2. Optionally, the first thickness T1 is greater than the second thickness T2. The first width W1 may be substantially the same as the second width W2. Optionally, a first ratio of a first thickness T1 of a first respective via block RVB1 to a first aperture width AP1 of a first respective gas releasing via rgrv1 in the first region R1 is greater than a second ratio of a second thickness T2 of a second respective via block RVB2 to a second aperture width AP2 of a second respective gas releasing via rgrv2 in the second region R2.

Figure 16:
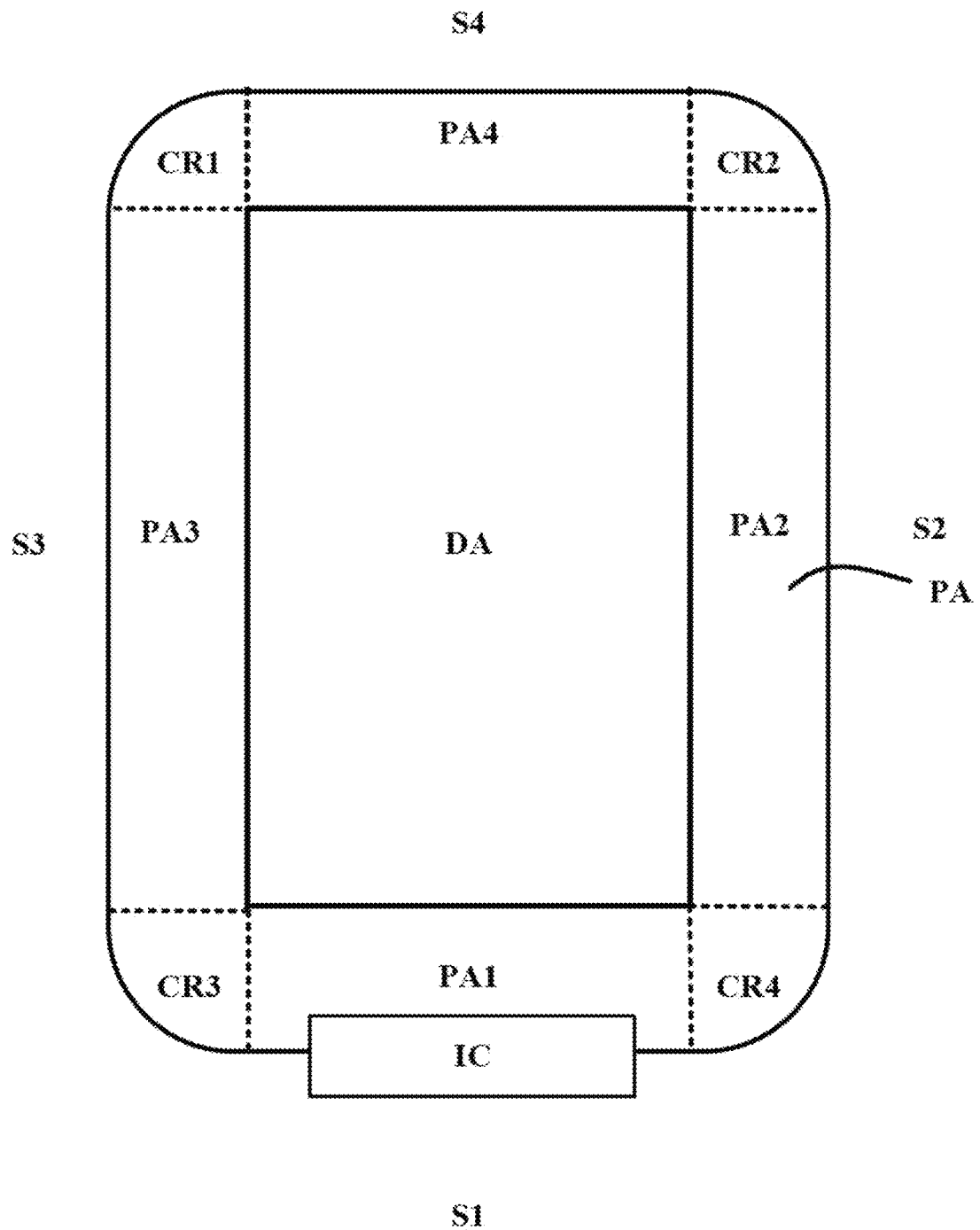
FIG. 16 is a schematic diagram illustrating the structure of a display apparatus in some embodiments according to the present disclosure.

In another aspect, the present disclosure provides a display apparatus, including the array substrate described herein, and one or more integrated circuits connected to the array substrate in an integrated circuit bonding region. FIG. 16 is a schematic diagram illustrating the structure of a display apparatus in some embodiments according to the present disclosure. Referring to FIG. 16, the display apparatus includes the array substrate described herein, and one or more integrated circuits IC connected to the array substrate in an integrated circuit bonding region.

In some embodiments, the display apparatus includes a display area DA and a peripheral area PA. In some embodiments, the peripheral area PA includes a first side-area PA1 on a first side S1 of the display area DA, a second side-area PA2 on a second side S2 of the display area DA, a third side-area PA3 on a third side S3 of the display area DA, a fourth side-area PA4 on a fourth side S4 of the display area DA. Optionally, the first side S1 and the fourth side S4 are opposite to each other. Optionally, the second side S2 and the third side S3 are opposite to each other. Optionally, the first side-area PA1 includes an integrated circuit bonding region onto which the one or more integrated circuits IC such as a display control integrated circuit and/or a touch control integrated circuit are bonded. In some embodiments, the peripheral area PA further includes a first corner region CR1 connecting the third side-area PA3 and the fourth side-area PA4, a second corner region CR2 connecting the second side-area PA2 and the fourth side-area PA4, a third corner region CR3 connecting the first side-area PA1 and the third side-area PA3, and a fourth corner region CR4 connecting the first side-area PA1 and the second side-area PA2.

Figure 17:
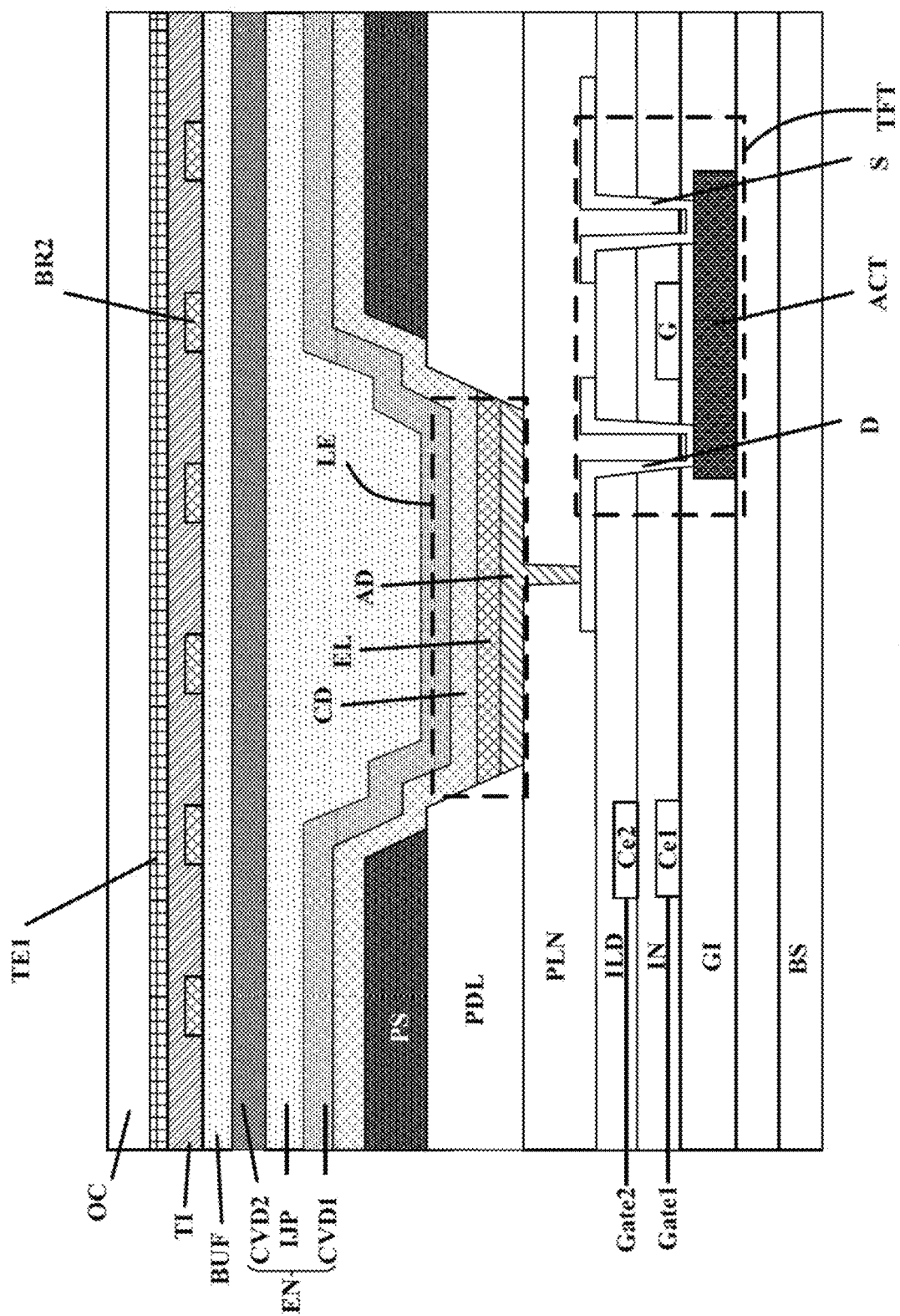
FIG. 17 illustrates a detailed structure in a display area in a display apparatus in some embodiments according to the present disclosure.

FIG. 17 illustrates a detailed structure in a display area in a display apparatus in some embodiments according to the present disclosure. Referring to FIG. 17, the display apparatus in the display area in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a planarization layer PLN on a side of the source electrode S and the drain electrode D away from the inter-layer dielectric layer ILD; a pixel definition layer PDL defining a subpixel aperture and on a side of the planarization layer PLN away from the base substrate BS; and a light emitting element LE in the subpixel aperture. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The display apparatus in the display area further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer UP on a side of the first inorganic encapsulating sub-layer CVD1 away from the base substrate BS, and a second inorganic encapsulating sub-layer CVD2 on a side of the organic encapsulating sub-layer UP away from the first inorganic encapsulating sub-layer CVD1. The display apparatus in the display area further includes a buffer layer BUF on a side of the encapsulating layer EN away from the base substrate BS; a plurality of second electrode bridges BR2 on a side of the buffer layer BUF away from the encapsulating layer EN; a touch insulating layer T1 on a side of the plurality of second electrode bridges BR2 away from the buffer layer BUF; a plurality of first touch electrodes TE1 on a side of the touch insulating layer T1 away from the buffer layer BUF; and an overcoat layer OC on a side of the plurality of first touch electrodes TE1 away from the touch insulating layer T1.

Figure 18:
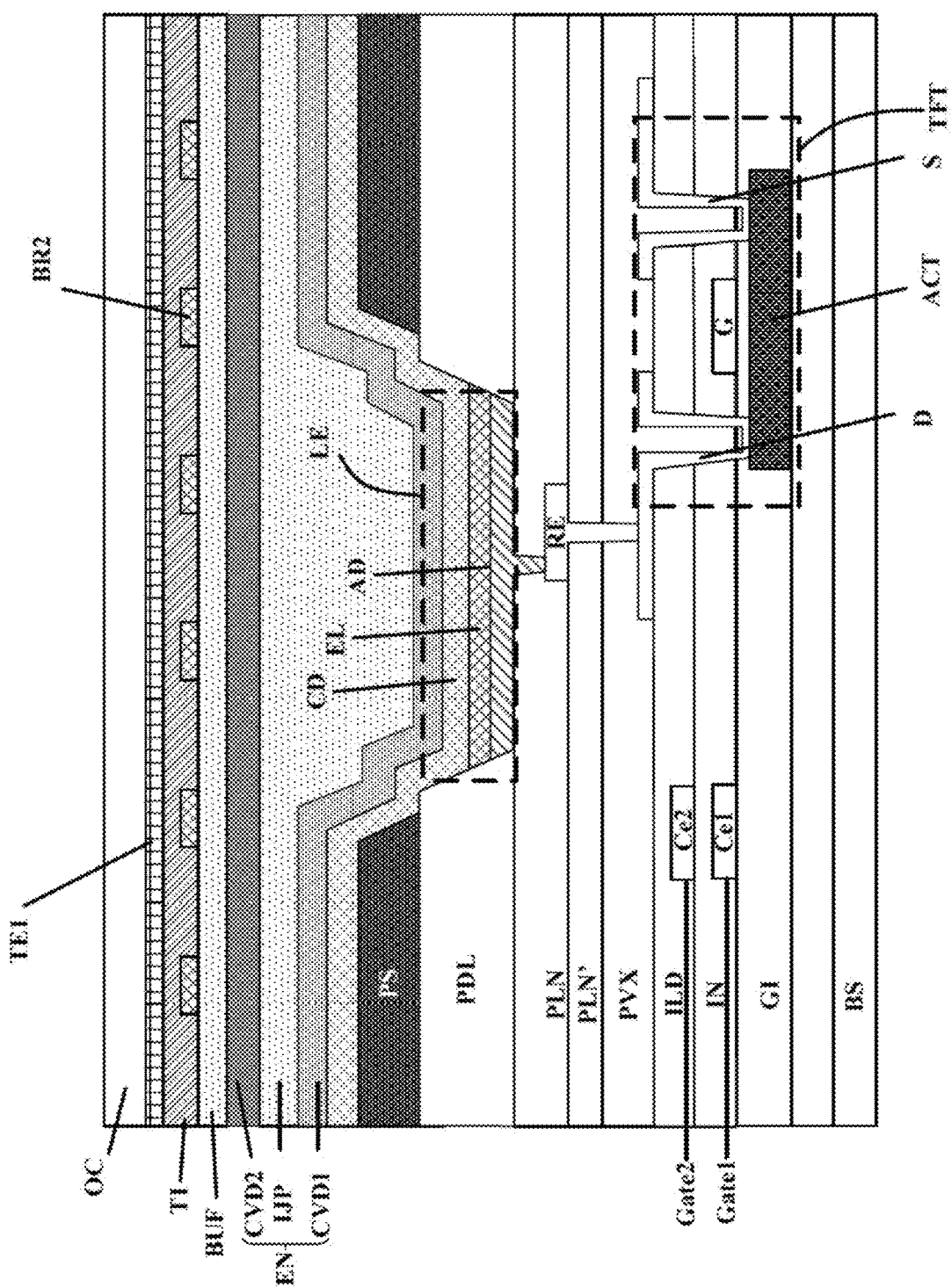
FIG. 18 illustrates a detailed structure in a display area in a display apparatus in some embodiments according to the present disclosure.

FIG. 18 illustrates a detailed structure in a display area in a display apparatus in some embodiments according to the present disclosure. Referring to FIG. 18, the display apparatus in the display area in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a passivation layer PVX on a side of the source electrode S and the drain electrode D away from the inter-layer dielectric layer ILD; a first planarization layer PLN' on a side of the passivation layer PVX away from the inter-layer dielectric layer ILD; a planarization layer PLN on side of the first planarization layer PLN' away from the passivation layer PVX; a relay electrode RE (part of a second SD metal layer) on a side of the planarization layer PLN away from the first planarization layer PLN'; a pixel definition layer PDL defining a subpixel aperture and on a side of the planarization layer PLN away from the base substrate BS; and a light emitting element LE in the subpixel aperture. The light emitting element LE includes an anode AD on a side of the planarization layer PLN away from the first planarization layer PLN'; a light emitting layer EL on a side of the anode AD away from the planarization layer PLN; and a cathode layer CD on a side of the light emitting layer EL away from the anode AD. The display apparatus in the display area further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer UP on a side of the first inorganic encapsulating sub-layer CVD1 away from the base substrate BS, and a second inorganic encapsulating sub-layer CVD2 on a side of the organic encapsulating sub-layer UP away from the first inorganic encapsulating sub-layer CVD1. The display apparatus in the display area further includes a buffer layer BUF on a side of the encapsulating layer EN away from the base substrate BS; a plurality of second electrode bridges BR2 on a side of the buffer layer BUF away from the encapsulating layer EN; a touch insulating layer T1 on a side of the plurality of second electrode bridges BR2 away from the buffer layer BUF; a plurality of first touch electrodes TE1 on a side of the touch insulating layer T1 away from the buffer layer BUF; and an overcoat layer OC on a side of the plurality of first touch electrodes TE1 away from the touch insulating layer T1. Optionally, the display apparatus in the display area does not include the passivation layer PVX, e.g., the inter-layer dielectric layer ILD is in direct contact with the first planarization layer PLN'.

Referring to FIG. 17 and FIG. 18, the planarization layer PLN in the display area of the display apparatus is in a same layer as the planarization layer PLN in the peripheral area as shown in FIG. 4. The anode AD in the display area of the display apparatus is in a same layer as the anode material layer AML in the peripheral area as shown in FIG. 4. The pixel definition layer PDL in the display area of the display apparatus is part of the pixel definition material layer, and is in a same layer as the plurality of via blocks VB in the peripheral area as shown in FIG. 6 to FIG. 8. The cathode layer CD in the display area of the display apparatus is in a same layer as the cathode material layer CML in the peripheral area as shown in FIG. 12F and FIG. 12G. Referring to FIG. 17, the source electrode S and the drain electrode D in the display area of the display apparatus is in a same layer as the signal line material layer pvss in the peripheral area as shown in FIG. 12F and FIG. 12G. Referring to FIG. 18, the relay electrode RE in the display area of the display apparatus is in a same layer as the signal line material layer pvss in the peripheral area as shown in FIG. 12F and FIG. 12G.

As used herein, the term "same layer" refers to the relationship between the layers simultaneously formed in the same step. In one example, the anode AD and the anode material layer AML are in a same layer when they are formed as a result of one or more steps of a same patterning process performed in a material deposited in a same deposition process. In another example, the anode AD and the anode material layer AML can be formed in a same layer by simultaneously performing the step of forming the anode AD and the step of forming the anode material layer AML. The term "same layer" does not always mean that the thickness of the layer or the height of the layer in a cross-sectional view is the same.

Figure 19:
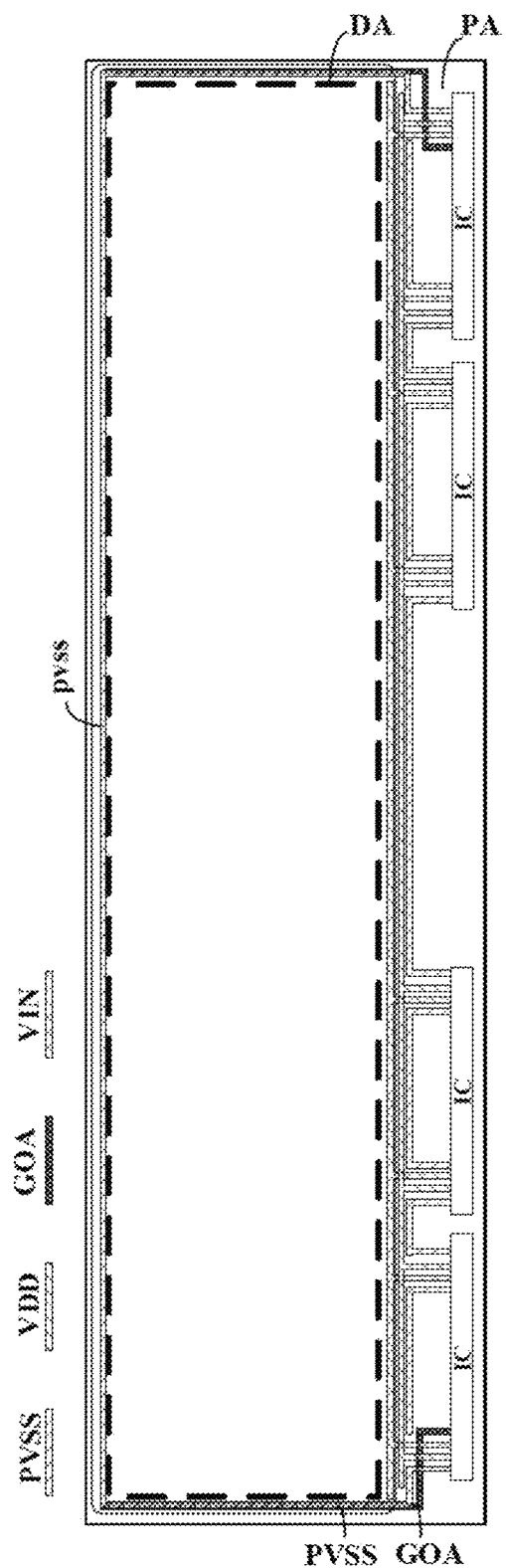
FIG. 19 is a schematic diagram illustrating a layout of certain signal lines in a display apparatus in some embodiments according to the present disclosure.

FIG. 19 is a schematic diagram illustrating a layout of certain signal lines in a display apparatus in some embodiments according to the present disclosure. Referring to FIG. 19, the display apparatus in some embodiments includes a peripheral voltage supply line PVSS in the peripheral area PA configured to provide a low voltage signal to cathodes of the plurality of light emitting elements in the display area DA. The display apparatus further includes one or more integrated circuits IC, one or more high voltage signal line VDD configured to provide a high voltage signal to pixel driving circuits of the display apparatus, one or more reset signal line VIN configured to provide an initialization signal to reset transistors in the pixel driving circuits, and one or more gate-on-array circuits GOA in a peripheral area PA. As shown in FIG. 19, at least a portion of the peripheral voltage supply line PVSS is on a side of the one or more gate-on-array circuits GOA away from a base substrate.

In another aspect, the present disclosure further provides a method of fabricating an array substrate. In some embodiments, the method includes forming a planarization layer on a base substrate; forming an anode material layer on the planarization layer and in a peripheral area of the array substrate; and forming a plurality of gas releasing vias extending through the anode material layer configured to release gas in the planarization layer during a fabrication process. Optionally, an aperture size of a first respective gas releasing via in a first region is smaller than an aperture size of a second respective gas releasing via in a second region.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
   a planarization layer;
   an anode material layer on the planarization layer and in a peripheral area of the array substrate;
   a plurality of gas releasing vias extending through the anode material layer configured to release gas in the planarization layer; and
   a pixel definition material layer comprising a plurality of via blocks spaced apart from each other on the anode material layer, a respective via block covering and filling a respective gas releasing via;
   wherein an aperture size of a first respective gas releasing via in a first region is smaller than an aperture size of a second respective gas releasing via in a second region;
   a portion of the respective via block outside the respective gas releasing via has a width greater than an aperture width of the respective gas releasing via;
   the plurality of via blocks are on a first portion of the anode material layer in a first sub-area of the peripheral area;
   the pixel definition material layer further comprises a pixel definition layer defining subpixel apertures for light emitting elements; and
   the pixel definition layer extends into a second sub-area of the peripheral area, covering and filling gas releasing vias in a second portion of the anode material layer; and
   in at least one corner region of the array substrate, at least one gas releasing via in the first sub-area has an aperture size smaller than an aperture size of at least one gas releasing via in the second sub-area.

2. The array substrate of claim 1, wherein a first ratio of a first width of a first respective via block to a first aperture width of a first respective gas releasing via in the first region is greater than a second ratio of a second width of a second respective via block to a second aperture width of a second respective gas releasing via in the second region.

3. The array substrate of claim 2, wherein the first width and the second width are substantially the same; and
   the first aperture width is smaller than the second aperture width.

4. The array substrate of claim 1, wherein the pixel definition layer continuously extends throughout in the second sub-area of the peripheral area.

5. The array substrate of claim 1, wherein, in at least one non-corner region of the array substrate, at least one gas releasing via in the first sub-area has an aperture size substantially the same as an aperture size of at least one gas releasing via in the second sub-area.

6. The array substrate of claim 1, wherein at least one gas releasing via in the first sub-area and in a corner region of the array substrate has an aperture size smaller than an aperture size of at least one gas releasing via in the first sub-area in a non-corner region of the array substrate.

7. The array substrate of claim 1, wherein the peripheral area comprises a first side-area on a first side of a display area, a second side-area on a second side of the display area, a third side-area on a third side of the display area, a fourth side-area on a fourth side of the display area;
the first side and the fourth side are opposite to each other;
the second side and the third side are opposite to each other;
the first side-area is configured to bond an integrated circuit;
at least one gas releasing via in the first sub-area and in a corner region connecting the second side-area and the fourth side-area or a corner region connecting the third side-area and the fourth side-area has an aperture size smaller than an aperture size of at least one gas releasing via in the first sub-area and in a corner region connecting the first side-area and the second side-area or a corner region connecting the first side-area and the third side-area.

8. The array substrate of claim 7, wherein the at least one gas releasing via in the first sub-area and in a corner region connecting the first side-area and the second side-area or a corner region connecting the first side-area and the third side-area has an aperture size smaller than an aperture size of at least one gas releasing via in the first sub-area and in a non-corner region of the array substrate.

9. The array substrate of claim 1, comprising a peripheral voltage supply line in the peripheral area;
wherein the anode material layer is a layer of the peripheral voltage supply line.

10. The array substrate of claim 9, wherein the peripheral voltage supply line is a signal line configured to provide a voltage signal to a cathode of a light emitting element in a display area of the array substrate.

11. The array substrate of claim 9, further comprising a pixel definition material layer on the anode material layer;
wherein the peripheral voltage supply line further comprises a cathode material layer in the peripheral area and on a side of the pixel definition material layer and the anode material layer away from the planarization layer; and
the cathode material layer is connected to the anode material layer.

12. The array substrate of claim 11, wherein the pixel definition material layer comprises:
a plurality of via blocks spaced apart from each other on the anode material layer, a respective via block covering and filling a respective gas releasing via; and
a pixel definition layer defining subpixel apertures for light emitting elements, respectively;
wherein the plurality of via blocks are in a first sub-area of the peripheral area;
the pixel definition layer extends into a second sub-area of the peripheral area; and
the cathode material layer is at least partially present in the first sub-area and at least partially absent in the second sub-area.

13. The array substrate of claim 9, wherein the peripheral voltage supply line further comprises a signal line material layer on a side of the planarization layer away from the anode material layer; and
the anode material layer is connected to the signal line material layer through one or more peripheral vias in the peripheral area and extending through the planarization layer;
wherein the array substrate further comprises a plurality of second gas releasing vias extending through the signal line material layer for releasing gas in an insulating layer underneath the signal line material layer; and
an orthographic projection of a second gas releasing via in the signal line material layer on a base substrate at least partially overlaps with an orthographic projection of a gas releasing via in the anode material layer on the base substrate.

14. The array substrate of claim 1, wherein a first thickness of a first respective via block in the first region is greater than a second thickness of a second respective via block in the second region; and
aperture sizes of gas releasing vias covered and filled by the first respective via block and the second respective via block, respectively, are substantially the same.

15. A display apparatus, comprising the array substrate of claim 1, and one or more integrated circuits connected to the array substrate in an integrated circuit bonding region.

16. An array substrate, comprising:
a planarization layer;
an anode material layer on the planarization layer and in a peripheral area of the array substrate;
a plurality of gas releasing vias extending through the anode material layer configured to release gas in the planarization layer; and
a pixel definition material layer comprising a plurality of via blocks spaced apart from each other on the anode material layer, a respective via block covering and filling a respective gas releasing via;
wherein an aperture size of a first respective gas releasing via in a first region is smaller than an aperture size of a second respective gas releasing via in a second region;
a portion of the respective via block outside the respective gas releasing via has a width greater than an aperture width of the respective gas releasing via;
the plurality of via blocks are on a first portion of the anode material layer in a first sub-area of the peripheral area;
the pixel definition material layer further comprises a pixel definition layer defining subpixel apertures for light emitting elements; and
the pixel definition layer extends into a second sub-area of the peripheral area, covering and filling gas releasing vias in a second portion of the anode material layer;
wherein at least one gas releasing via underneath an edge part of the pixel definition layer bordering the first sub-area has an aperture size smaller than an aperture size of at least one gas releasing via in the first sub-area, and smaller than an aperture size of at least one gas releasing via underneath a non-edge part of the pixel definition layer.

17. An array substrate, comprising:
a planarization layer;

an anode material layer on the planarization layer and in a peripheral area of the array substrate;

a plurality of gas releasing vias extending through the anode material layer configured to release gas in the planarization layer; and a pixel definition material layer comprising a plurality of via blocks spaced apart from each other on the anode material layer, a respective via block covering and filling a respective gas releasing via;

wherein an aperture size of a first respective gas releasing via in a first region is smaller than an aperture size of a second respective gas releasing via in a second region;

a portion of the respective via block outside the respective gas releasing via has a width greater than an aperture width of the respective gas releasing via;

the plurality of via blocks are on a first portion of the anode material layer in a first sub-area of the peripheral area;

the pixel definition material layer further comprises a pixel definition layer defining subpixel apertures for light emitting elements; and the pixel definition layer extends into a second sub-area of the peripheral area, covering and filling gas releasing vias in a second portion of the anode material layer;

wherein at least one gas releasing via in the first sub-area bordering an edge part of the pixel definition layer has an aperture size smaller than an aperture size of at least another gas releasing via in the first sub-area, the at least another gas releasing via being spaced apart from the edge part by the at least one gas releasing via.

* * * * *